`(12)` United States Patent
Shimizu et al.

`(10)` Patent No.: US 7,960,793 B2
`(45)` Date of Patent: Jun. 14, 2011

`(54)` SEMICONDUCTOR DEVICE

`(75)` Inventors: Tatsuo Shimizu, Tokyo (JP); Masato Koyama, Kanagawa-ken (JP)

`(73)` Assignee: Kabushiki Kaisha Toshiba, Tokyo (JP)

`( * )` Notice: Subject to any disclaimer, the term of this patent is extended or adjusted under 35 U.S.C. 154(b) by 201 days.

`(21)` Appl. No.: 12/370,641

`(22)` Filed: Feb. 13, 2009

`(65)` Prior Publication Data

US 2009/0200616 A1    Aug. 13, 2009

`(30)` Foreign Application Priority Data

Feb. 13, 2008  (JP) ................. 2008-031770

`(51)` Int. Cl.
*H01L 29/78*   (2006.01)
`(52)` U.S. Cl. ........ 257/368; 257/369; 257/410; 257/412; 257/E29.255
`(58)` Field of Classification Search .......... 257/368–369, 257/410, 412, E29.255
See application file for complete search history.

`(56)` References Cited

U.S. PATENT DOCUMENTS

| | | | |
|---|---|---|---|
| 2008/0315328 A1* | 12/2008 | Yu et al. | 257/407 |
| 2009/0166747 A1* | 7/2009 | Niimi et al. | 257/369 |

OTHER PUBLICATIONS

U.S. Appl. No. 12/189,400, filed Aug. 11, 2008, Shimizu, et al.
M. Kadoshima, et al., "Fermi-level pinning position modulation by Al-containing metal gate for cost-effective dual-metal/dual-high-k CMOS", 2007 Symposium on VLSI Technology Digest of Technical Papers, 2007, pp. 66-67.
P. Sivasubramani, et al., Dipole Moment Model Explaining nFET $V_t$ Tuning Utilizing La, Sc, Er, and Sr Doped HfSiON Dielectrics, 2007 Symposium on VLSI Technology Digest of Technical Papers, 2007, pp. 68-69.
U.S. Appl. No. 12/714,841, filed Mar. 1, 2010, Shimizu, et al.

\* cited by examiner

*Primary Examiner* — Cuong Q Nguyen
*Assistant Examiner* — Trang Q Tran
`(74)` *Attorney, Agent, or Firm* — Oblon, Spivak, McClelland, Maier & Neustadt, L.L.P.

`(57)` ABSTRACT

According to one embodiment, it is possible to provide a semiconductor device provided with an MIS transistor which has an effective work function being, as much as possible, suitable for low threshold operation. A CMIS device provided with an electrode having an optimal effective work function and enabling low threshold operation to achieve by producing an in-gap level by the addition of a high valence metal in an Hf (or Zr) oxide and changing a position of the in-gap level by nitrogen or fluorine or the like has been realized.

11 Claims, 19 Drawing Sheets

[FIG. 1]
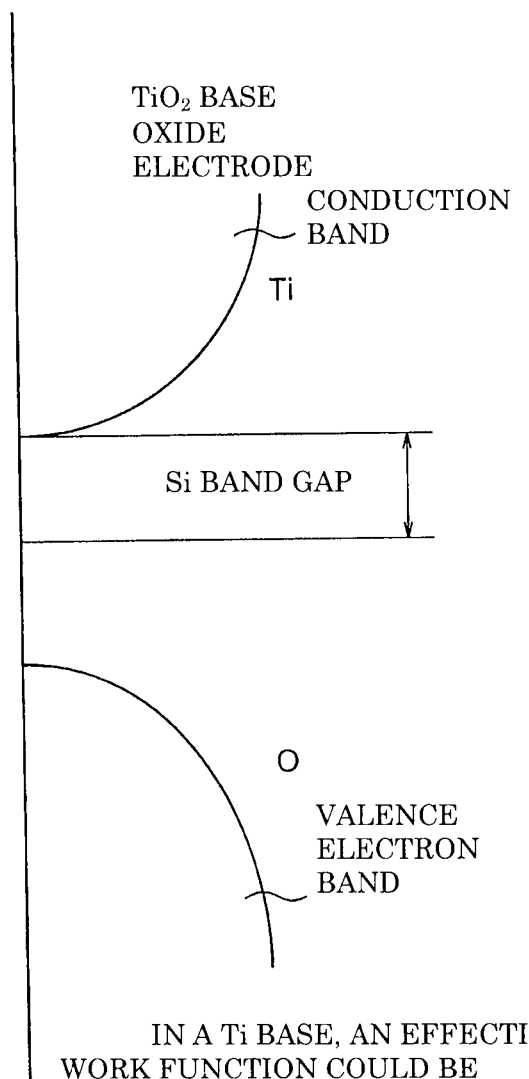

[FIG. 2]
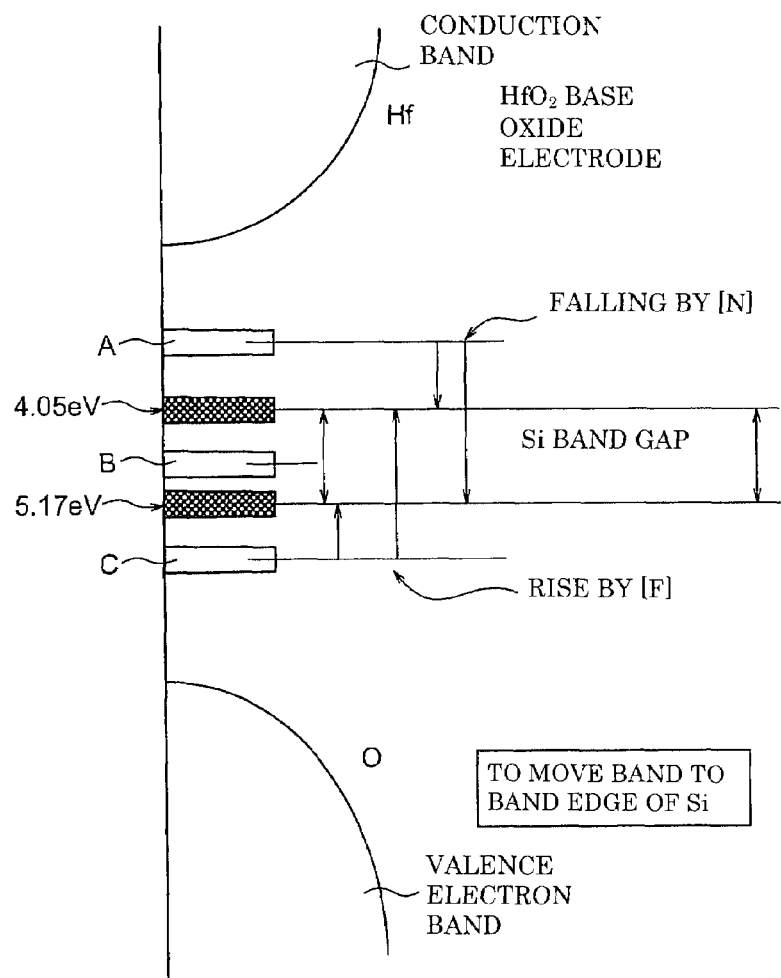

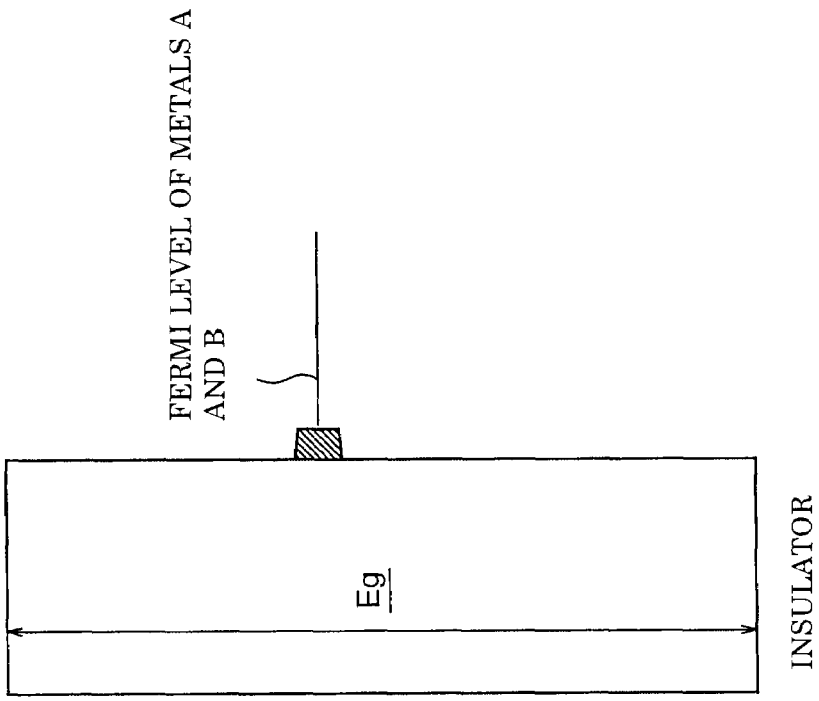
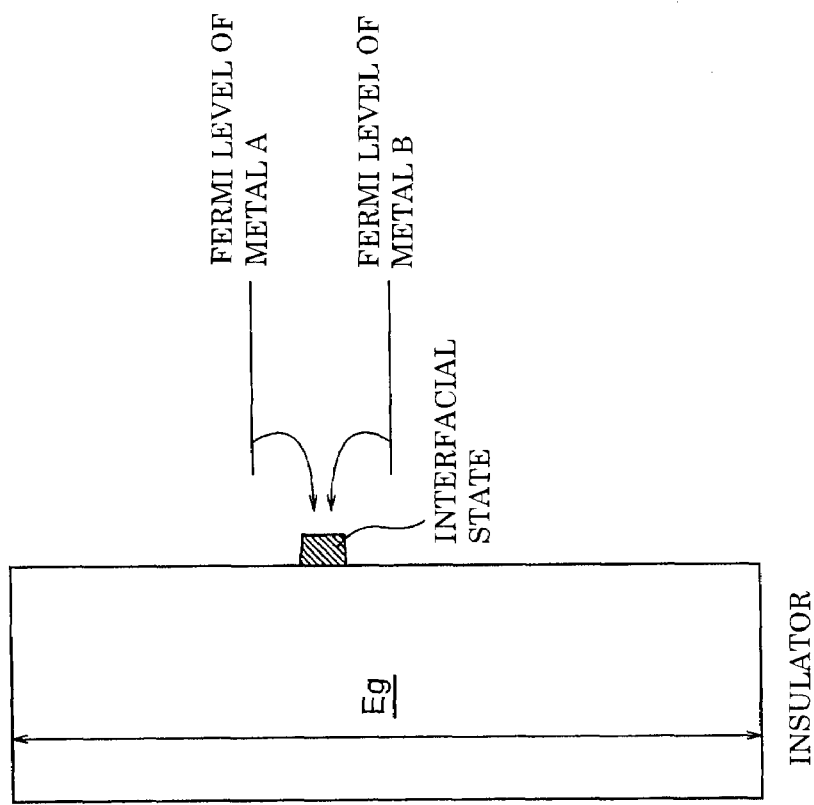

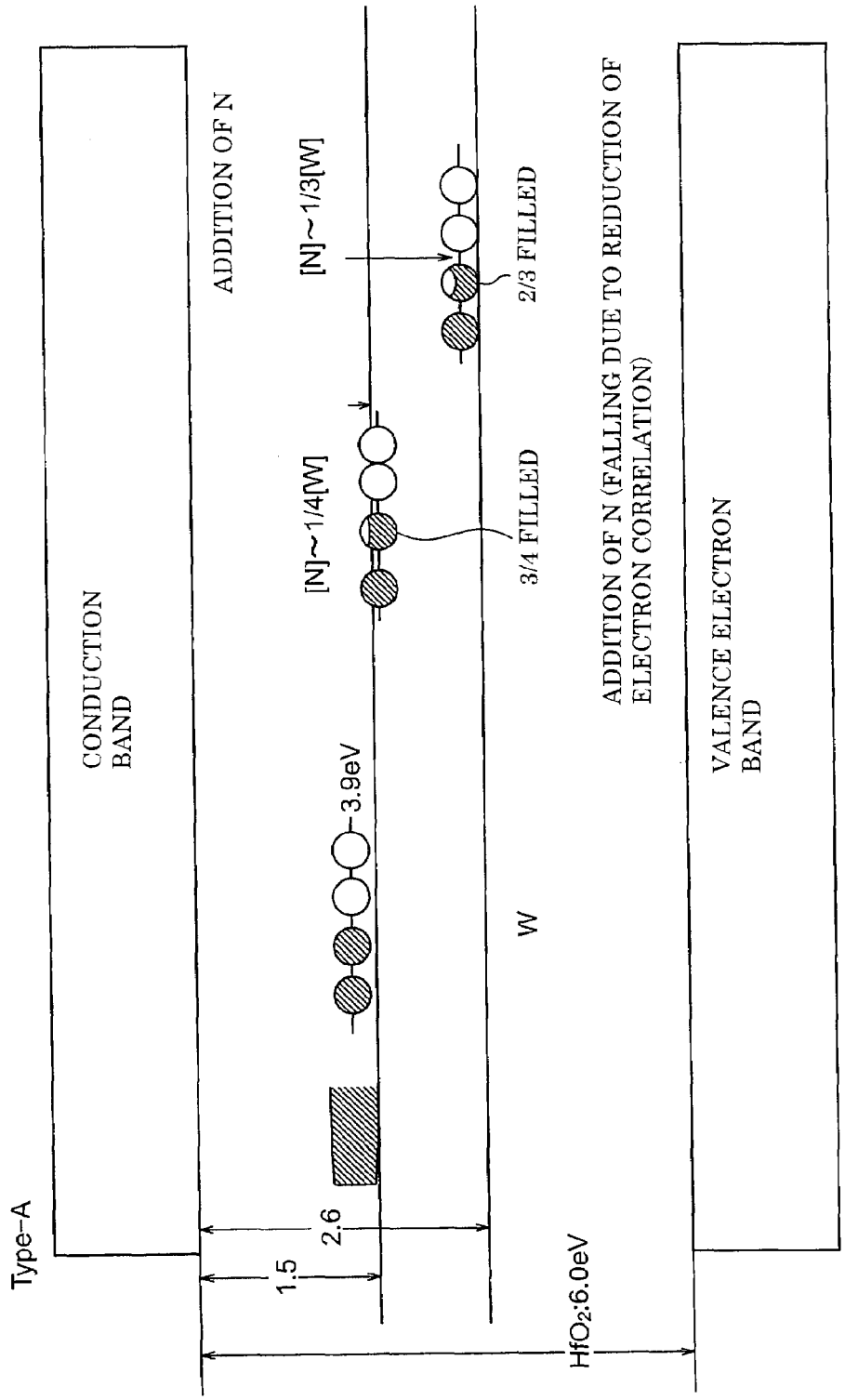
[Fig. 4]

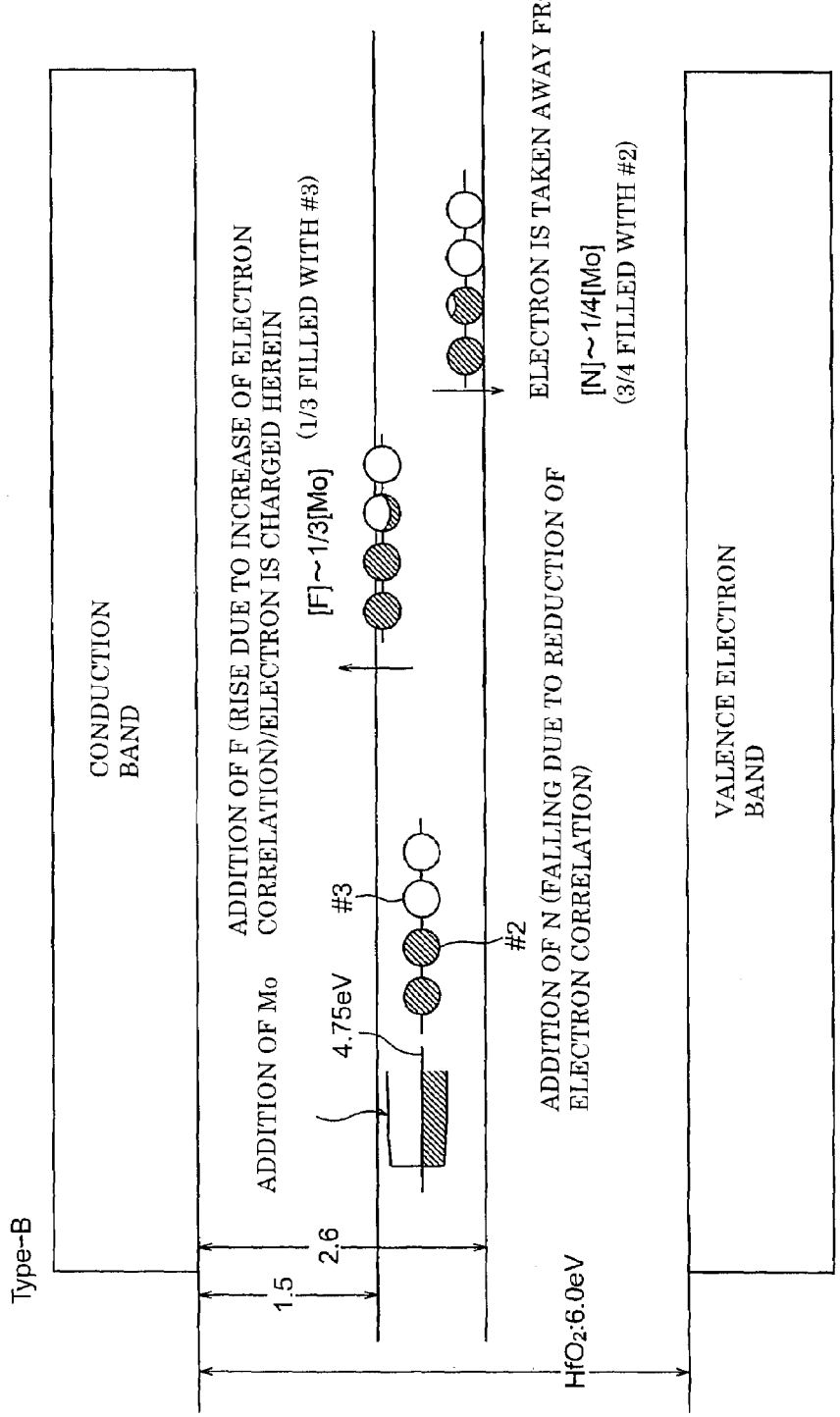
[Fig. 5]

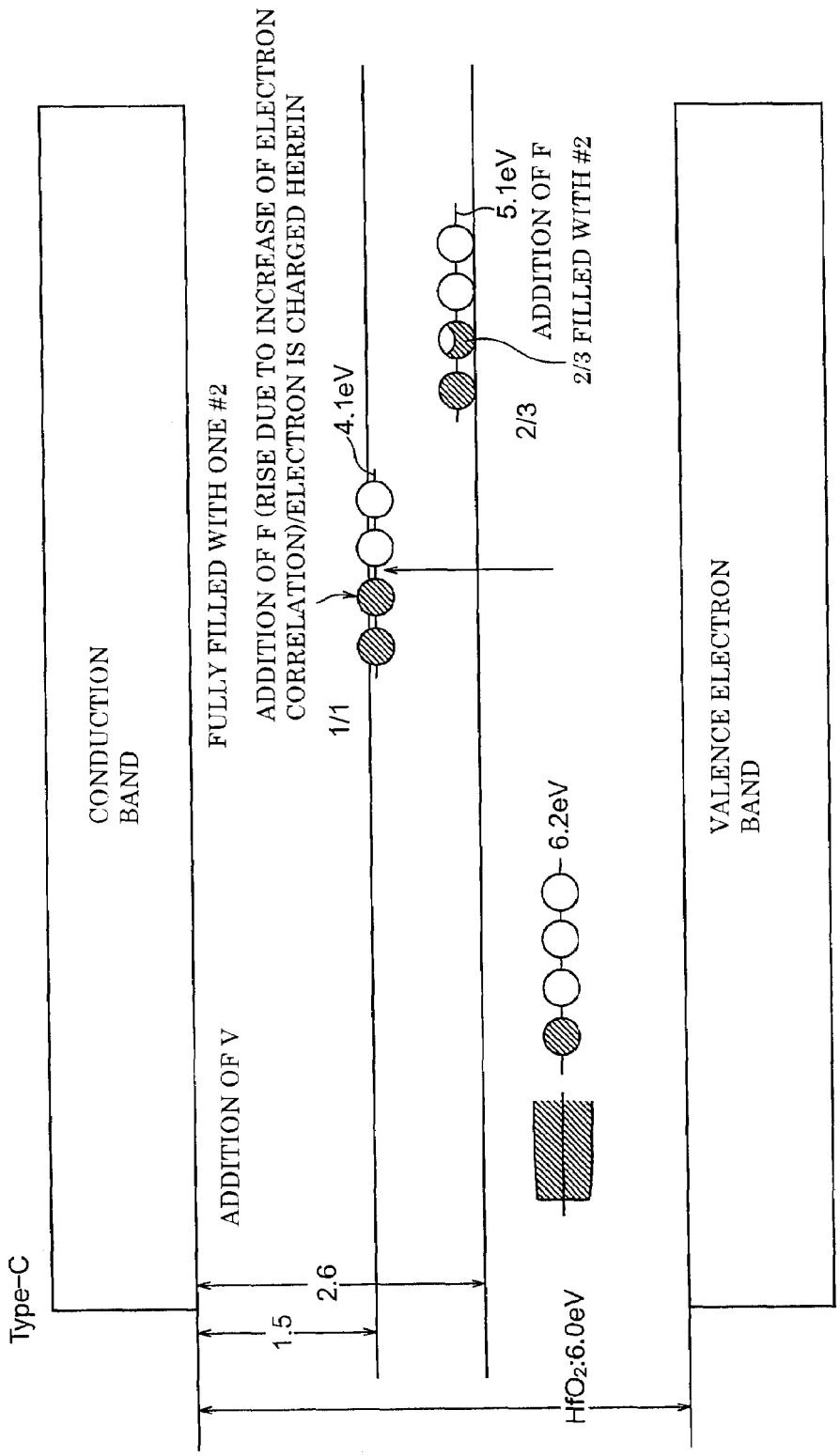

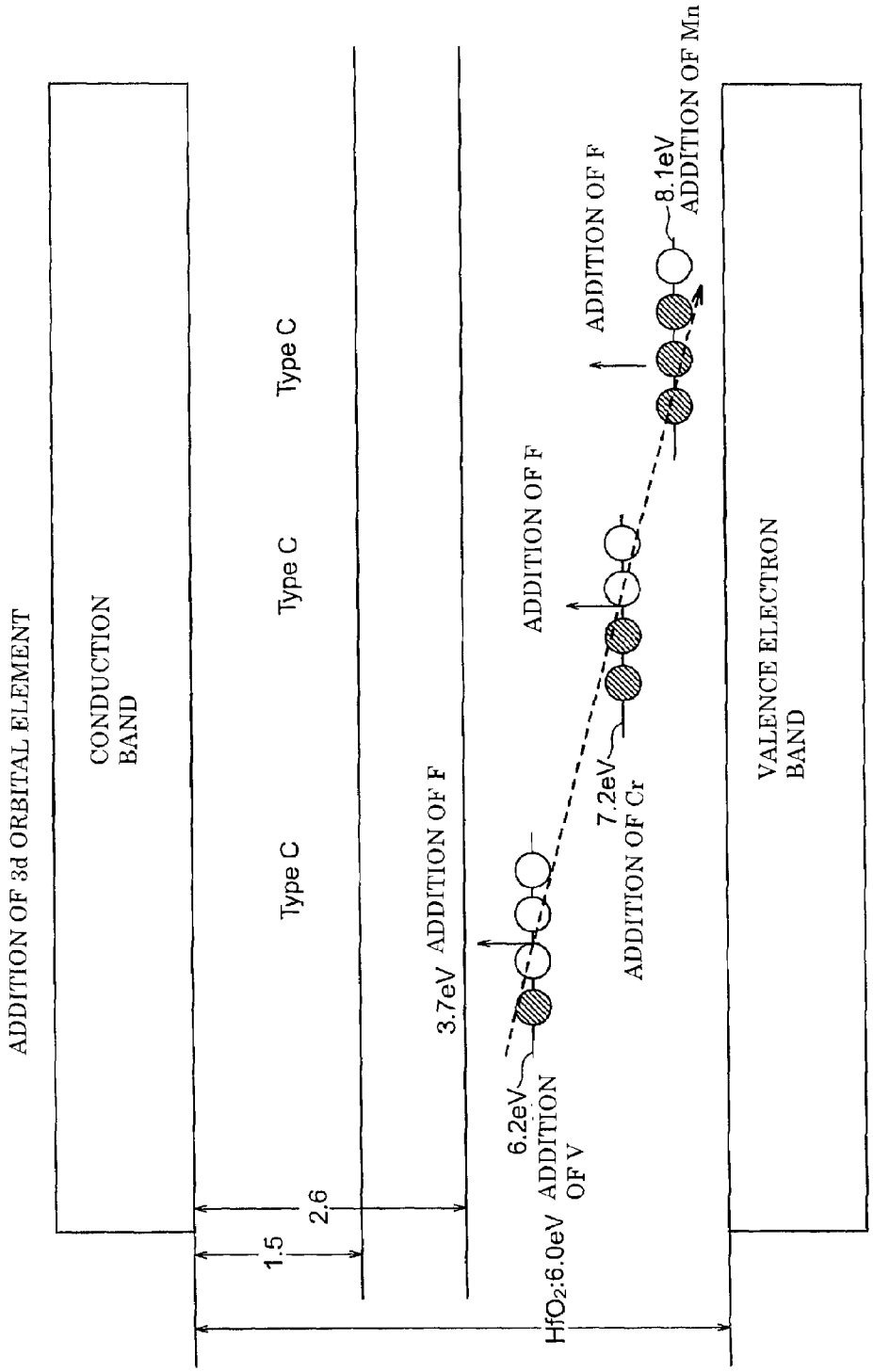

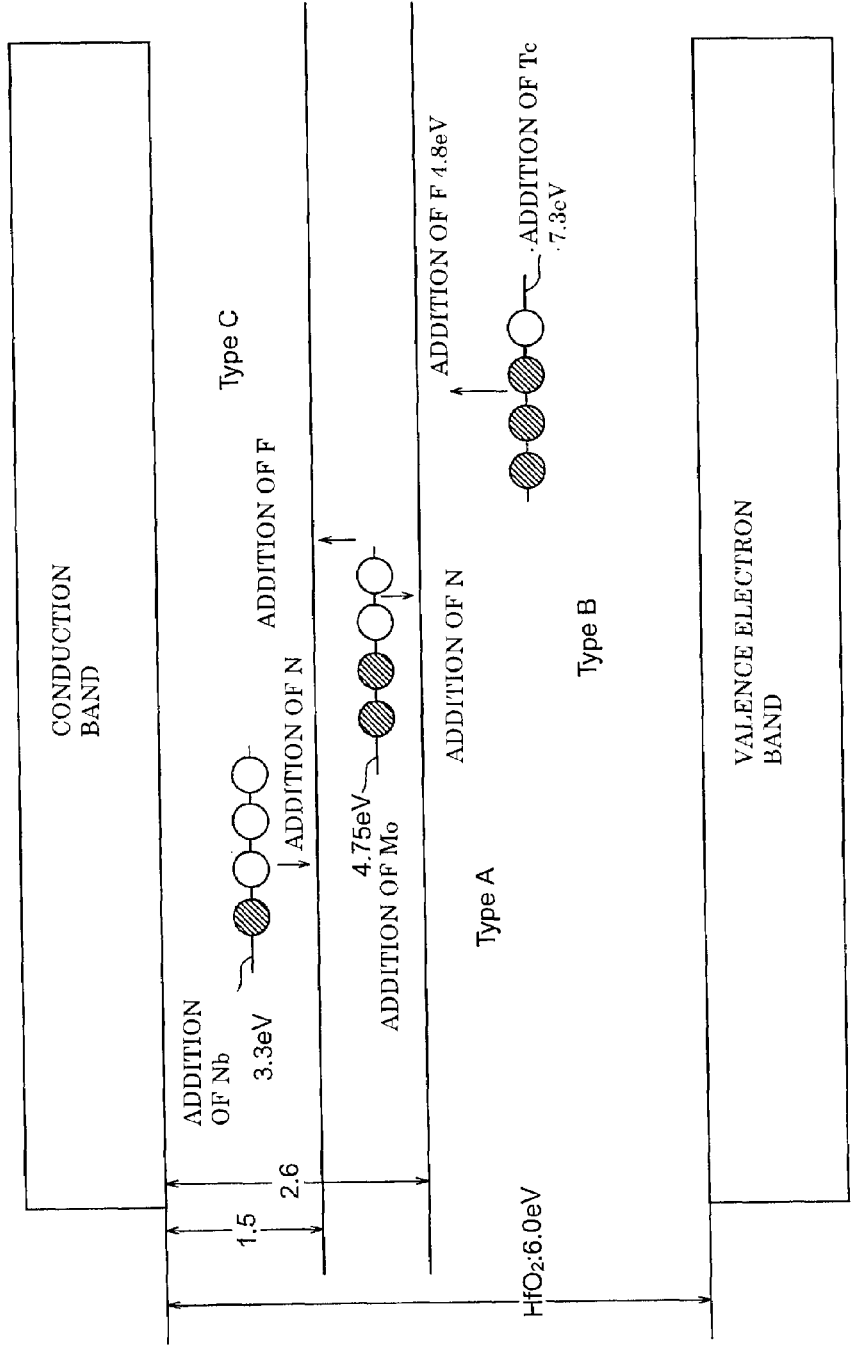
[FIG. 8]

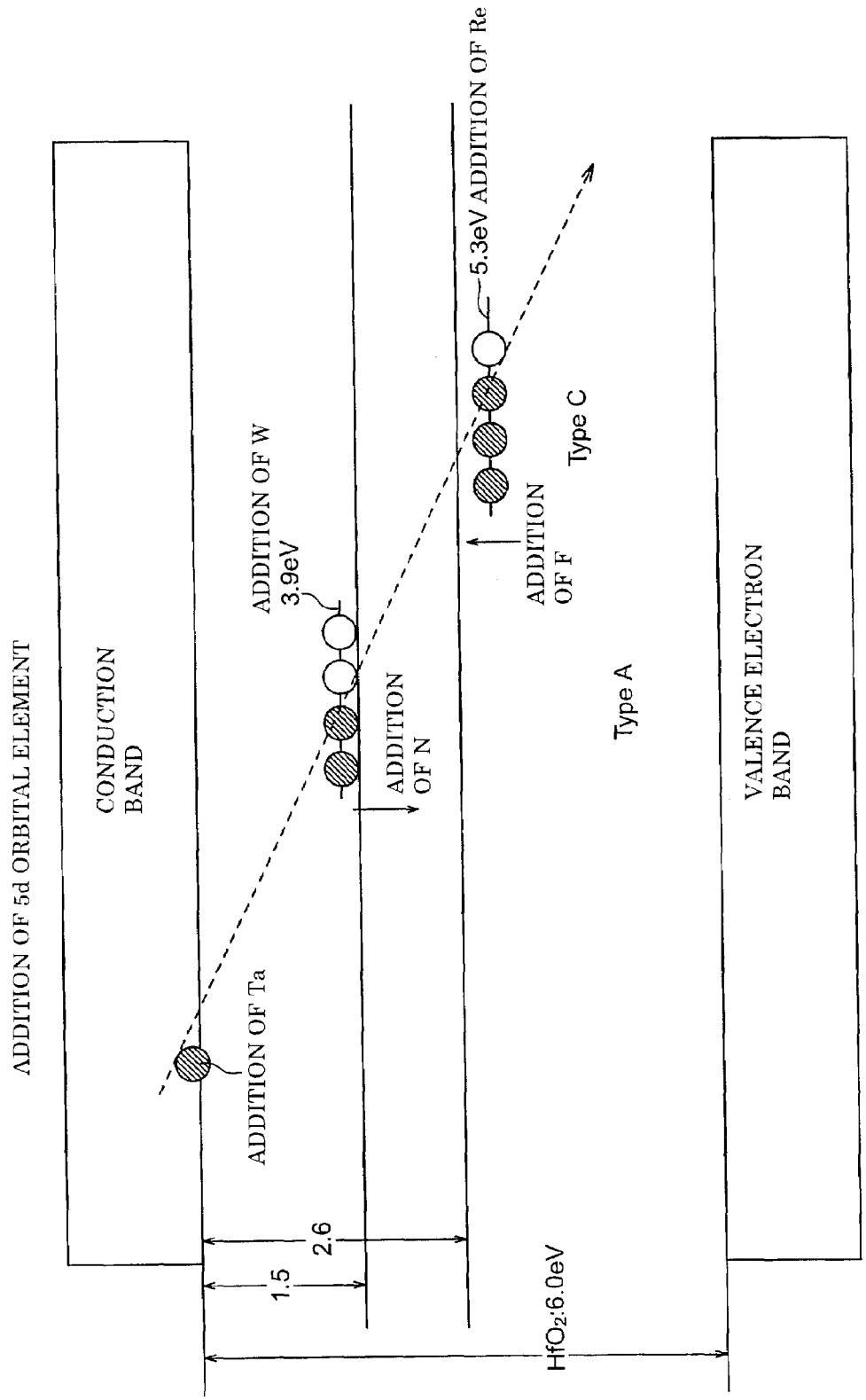
[FIG. 9]

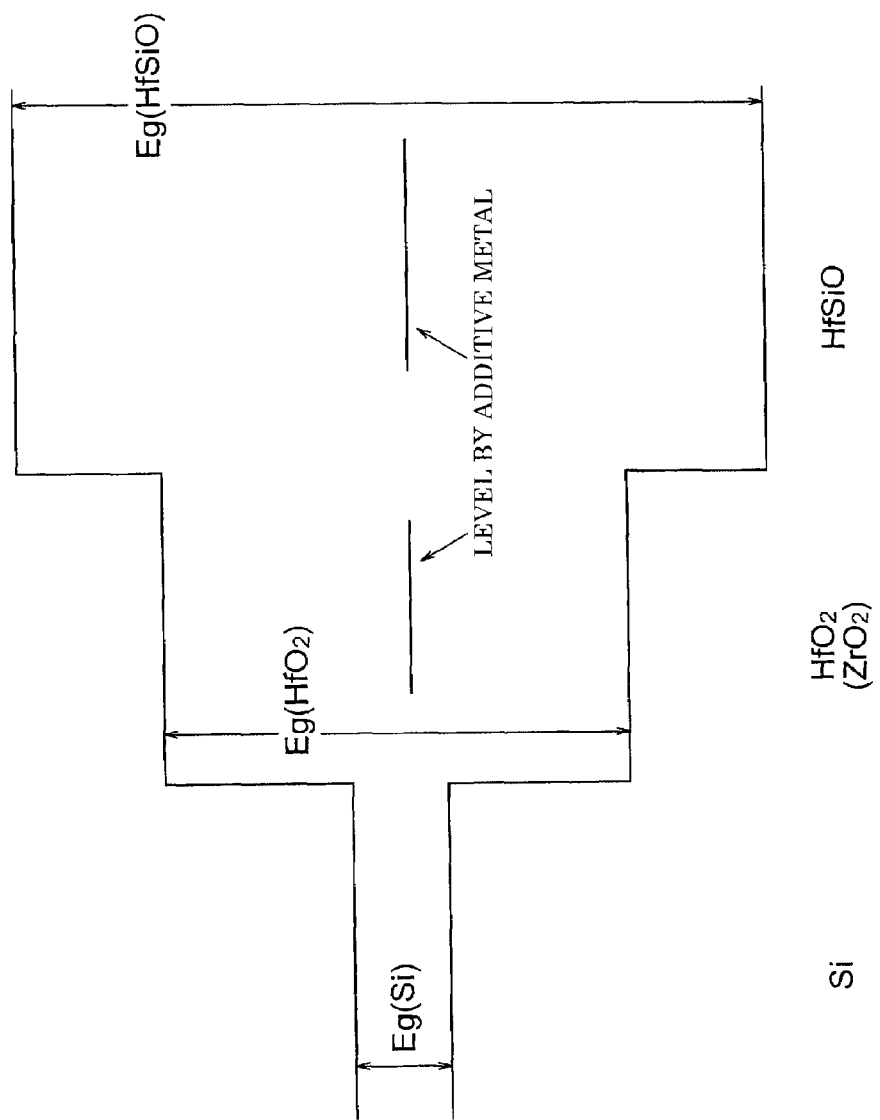
[FIG. 10]

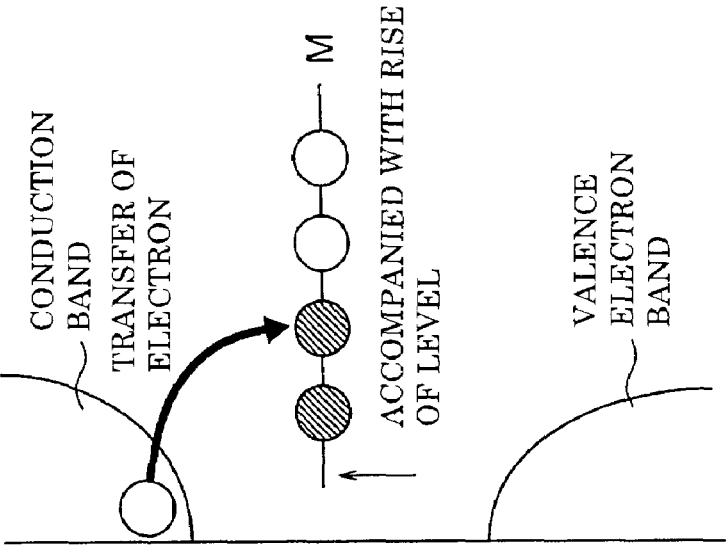
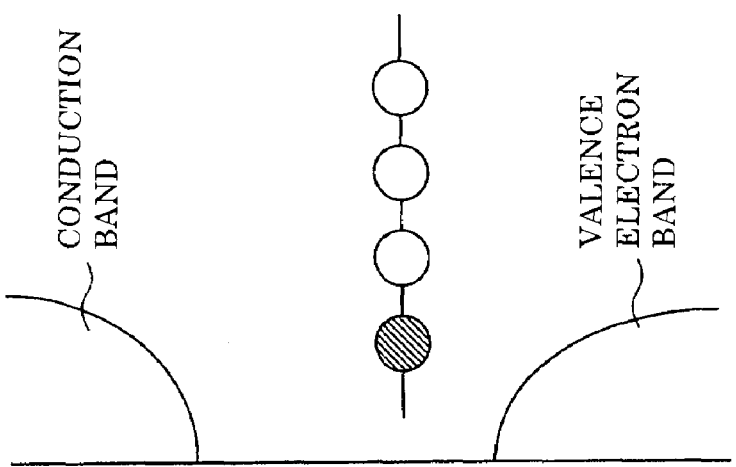
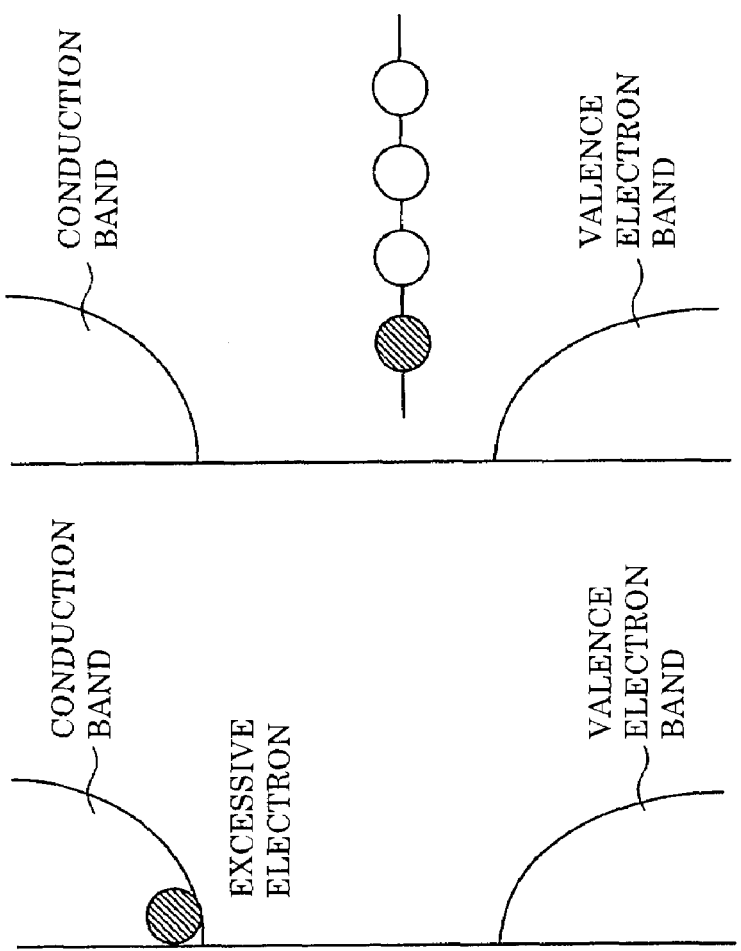

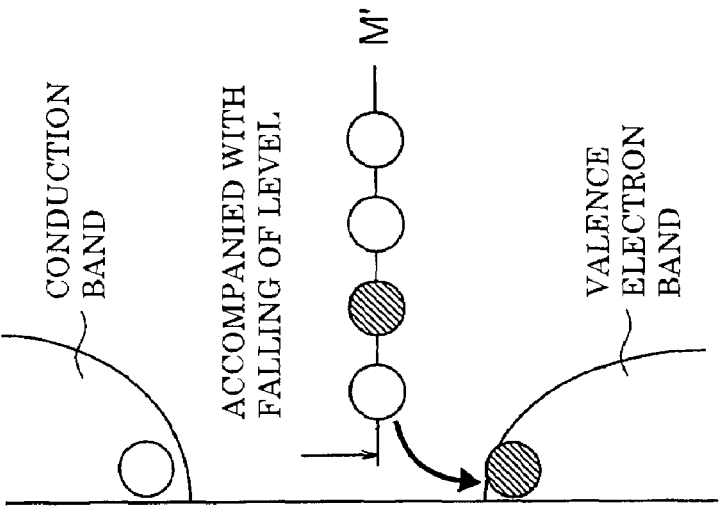
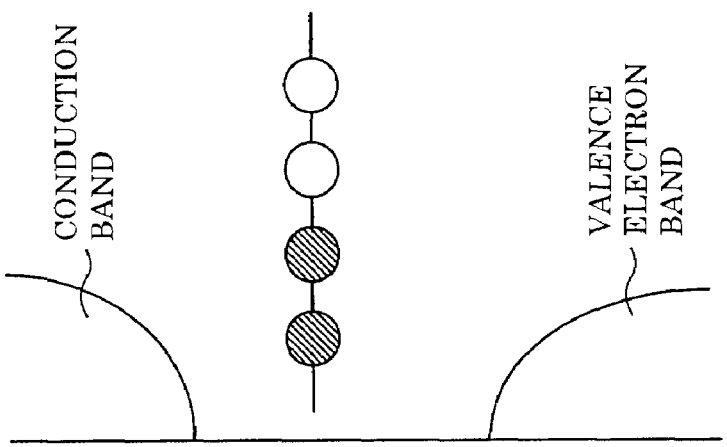
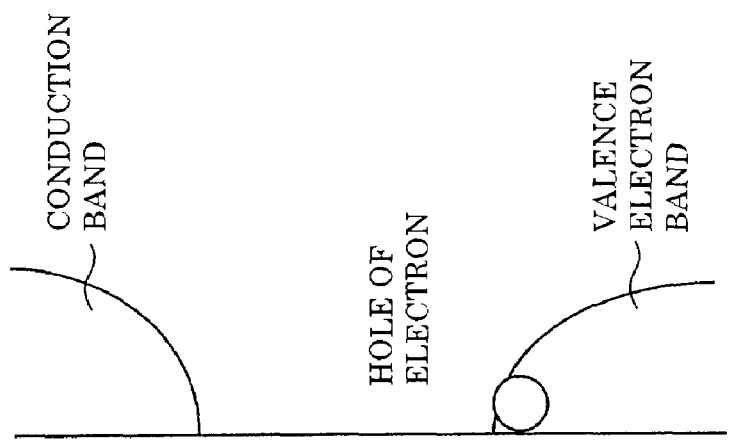

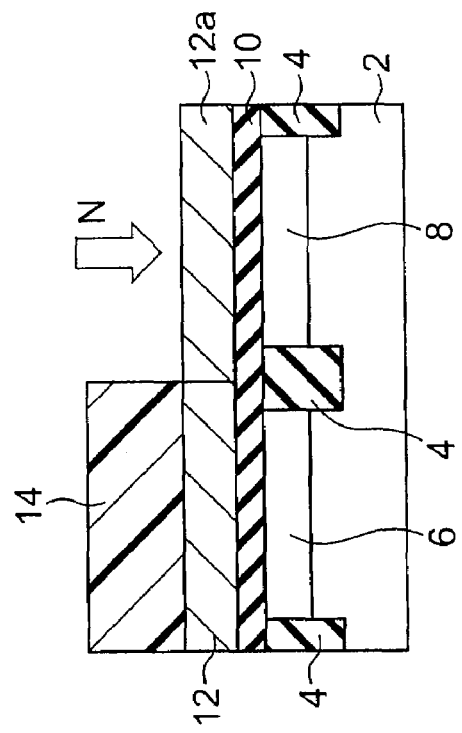
[FIG. 13B]
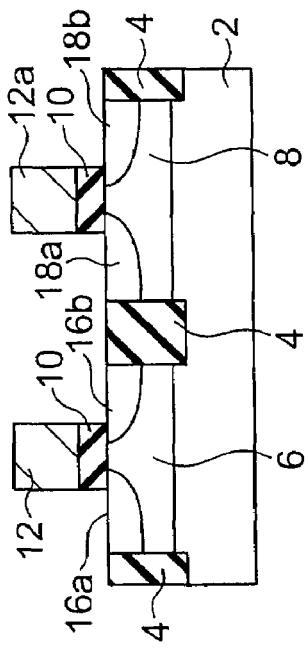
[FIG. 13C]
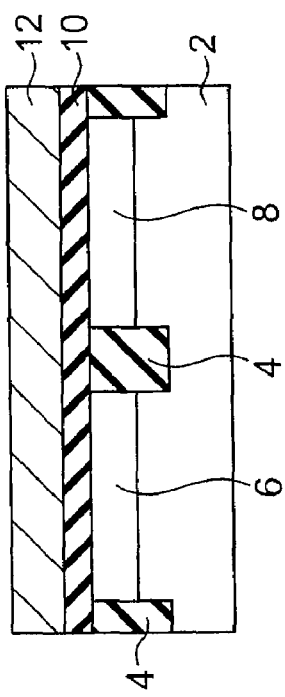
[FIG. 13A]

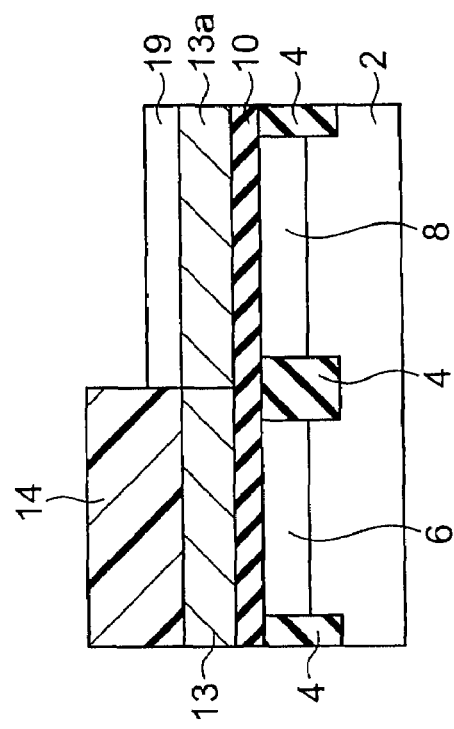
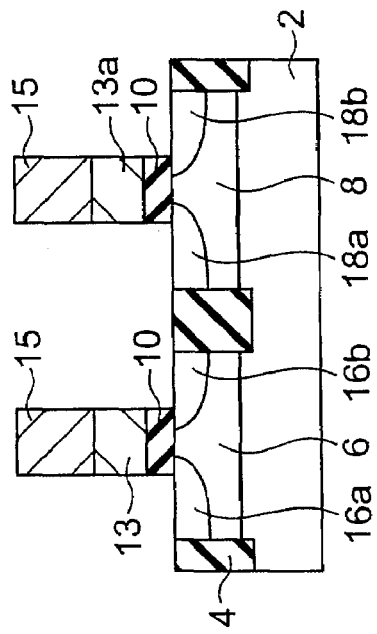
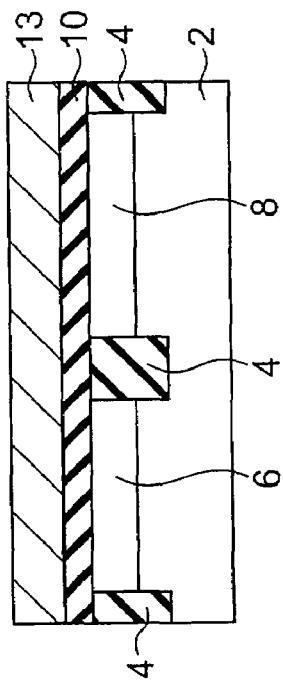

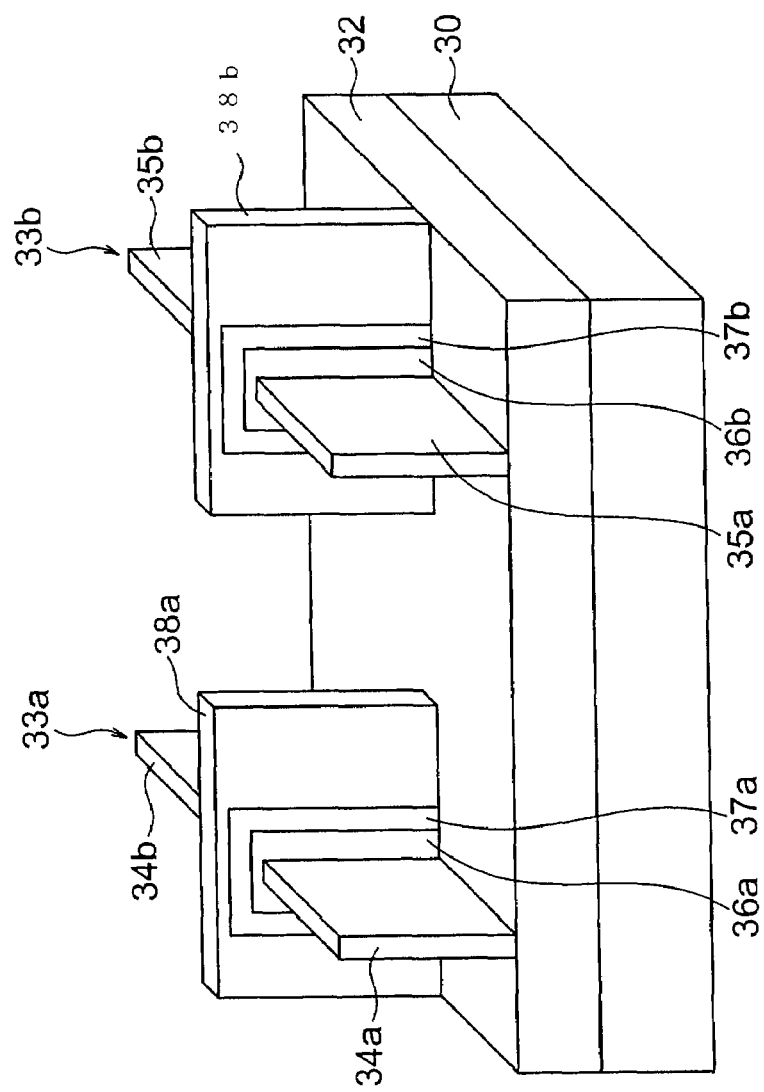
[FIG. 15]

[FIG. 16]
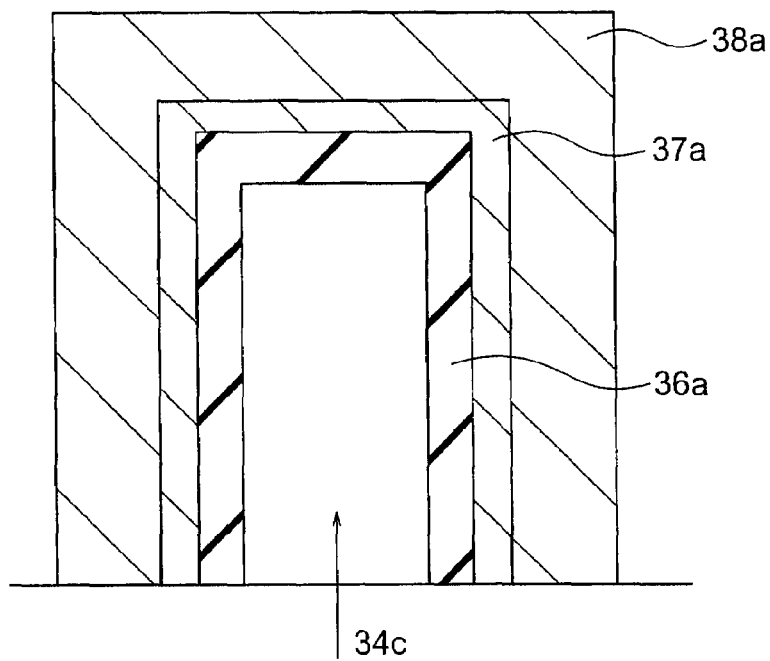

[FIG. 17]
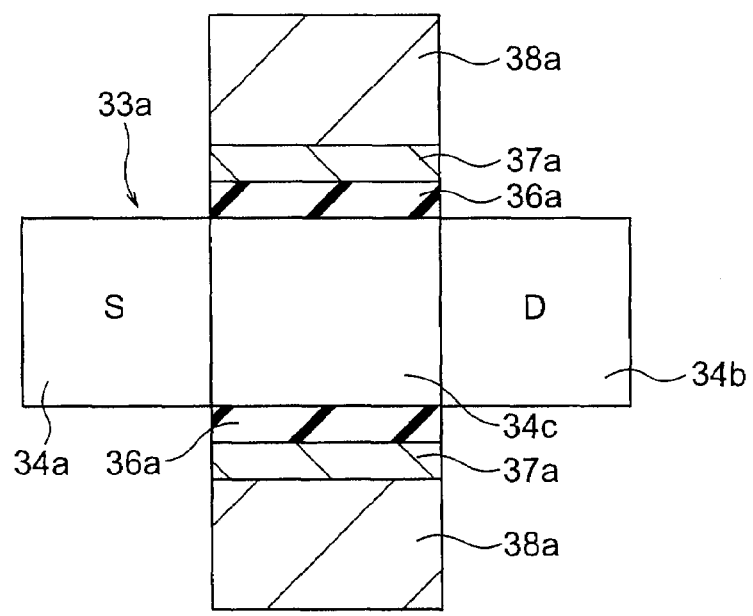

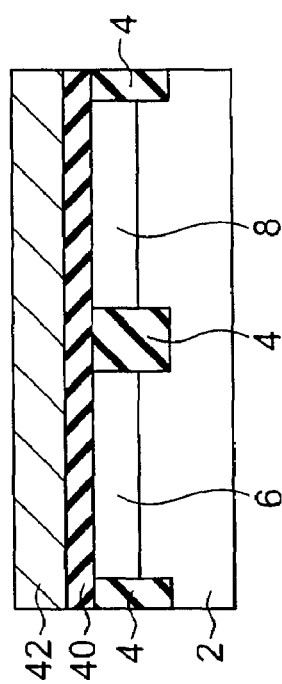
[FIG. 18A]
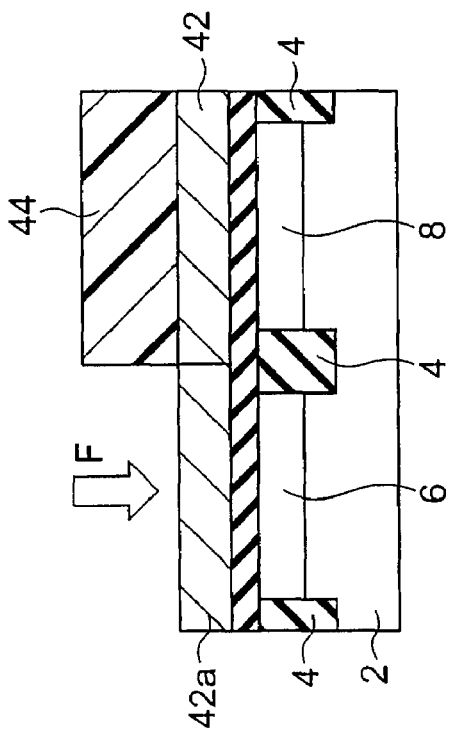
[FIG. 18B]
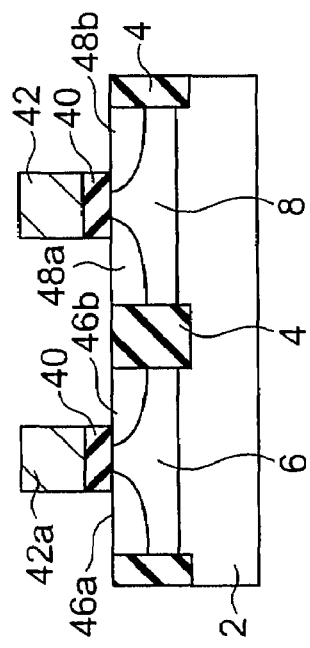
[FIG. 18C]

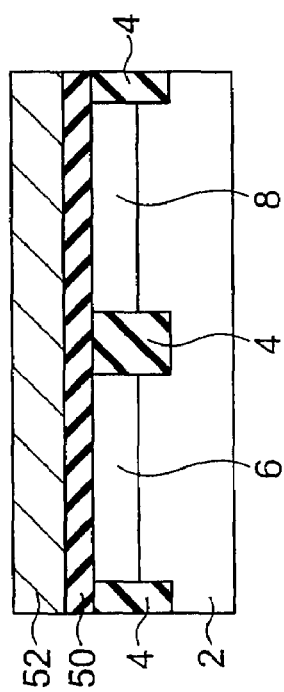
[FIG. 19A]
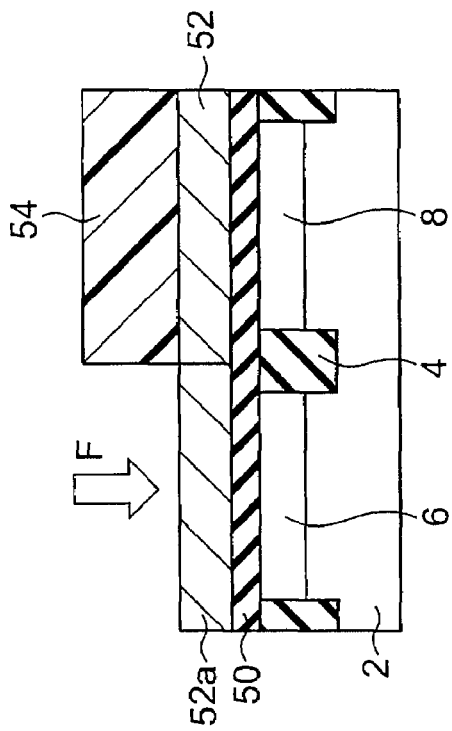
[FIG. 19B]
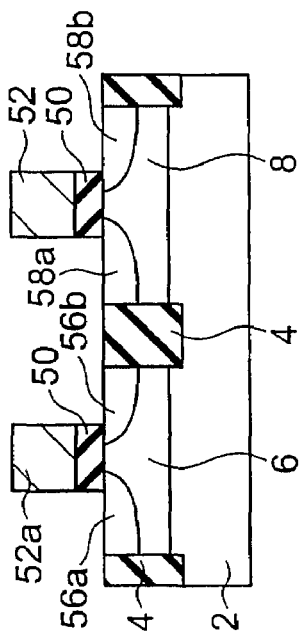
[FIG. 19C]

SEMICONDUCTOR DEVICE

CROSS-REFERENCE TO RELATED APPLICATIONS

This application is based upon and claims the benefit of priority from prior Japanese Patent Application No. 2008-31770, filed Feb. 13, 2008, the entire contents of which are incorporated herein by reference.

BACKGROUND

1. Technical Field

Exemplary embodiments described herein relate to a semiconductor device.

2. Description of the Related Art

Before, in order to secure the charge quantity induced by the channel of a MISFET (metal insulator semiconductor field effect transistor), a gate dielectric film has been decreased in thickness and a capacity has been enlarged.

As the result, a thin gate dielectric film ($SiO_2$ film) is promoted, and its thickness can be below 1 nm.

However, when the gate electrode made of polycrystalline silicon is formed on the gate dielectric film made of $SiO_2$, a depletion layer will arise in an interface with the gate dielectric film, and an Equivalent Oxide Thickness (EOT) of the gate dielectric film will increase.

When promoting a thin gate dielectric film, and to reach an EOT of a gate dielectric film being greatly below 1 nm, such EOT increase is a very big problem.

In order to address this problem, a method of using an oxide electrode is proposed in Japanese Patent Publication No. 2005-191354 (patent document 1).

In patent document 1, oxide conductors, such as $Sr(Ti, Ru)O_3$, are used as an electrode.

SUMMARY

In patent document 1 the work function of the created metal is not at an optimum value.

Since the oxide electrode of a Ti base in patent document 1 has a low stability as compared with the oxide of a Hf base or a Zr base, a possibility of giving oxygen to a gate dielectric film becomes high, and the effective work function of the gate electrode for nMIS transistors becomes a large value.

That is, in order to fulfill the performance, such as low threshold operation, demanded in a next generation CMIS (Complementary-Metal-Insulator-Semiconductor) transistor, an improved effective work function is desired.

Possible embodiments of this invention are made in consideration of the above-mentioned situation, and some embodiments of this invention may provide the semiconductor device with the MIS transistor which has the effective work function being, as much as possible, suitable for low threshold operation.

According to a first aspect of the present disclosure, there is provided a semiconductor device including:

a semiconductor substrate having a first semiconductor layer and a second semiconductor layer separated from each other;

an nMIS transistor including, a first source region and a first drain region, which regions are formed in the first semiconductor layer and separated from each other, a first gate dielectric film covering a first channel region which is the first semiconductor layer between the first source region and the first drain region, and a first gate electrode formed on the first gate dielectric film and including an Hf oxide film or a Zr oxide film in which a first element selected from a first group including Nb and W is added, and a second element selected from a second group including N, C, B, Mg, Ca, Sr, Ba, Al, Sc, Y, La, Ce, Pr, Nd, Pm, Sm, Eu, Gd, Tb, Dy, Ho, Er, Tm, Yb and Lu is added; and a pMIS transistor including, a second source region and a second drain region, which regions are formed in the second semiconductor layer and separated from each other, a second gate dielectric film covering a second channel region which is the second semiconductor layer between the second source region and the second drain region, and a second gate electrode formed on the second gate dielectric film and including an Hf oxide film or a Zr oxide film in which the first element is added, and the second element is added in a larger amount than that in the first gate electrode.

According to a second aspect of the present disclosure, there is provided a method for manufacturing a semiconductor device including:

a semiconductor substrate having a first semiconductor layer and a second semiconductor layer separated from each other;

an nMIS transistor including, a first source region and a first drain region, which regions are formed in the first semiconductor layer and separated from each other, a first gate dielectric film covering a first channel region which is the first semiconductor layer between the first source region and the first drain region, a first gate electrode formed on the first gate dielectric film and including an Hf oxide film or a Zr oxide film in which Mo is added, and a first element selected from a first group including F, H and Ta is added; and a pMIS transistor including, a second source region and a second drain region, which regions are formed in the second semiconductor layer and separated from each other, a second gate dielectric film covering a second channel region which is the second semiconductor layer between the second source region and the second drain region, and a second gate electrode formed on the second gate dielectric film and including an Hf oxide film or a Zr oxide film in which Mo is added, and a second element selected from a second group including N, C, B, Mg, Ca, Sr, Ba, Al, Sc, Y, La, Ce, Pr, Nd, Pm, Sm, Eu, Gd, Tb, Dy, Ho, Er, Tm, Yb and Lu is added.

According to a third aspect of the present disclosure, there is provided a method for manufacturing a semiconductor device including:

a semiconductor substrate having a first semiconductor layer and a second semiconductor layer separated from each other;

an nMIS transistor including, a first source region and a first drain region, which regions are formed in the first semiconductor layer and separated from each other, a first gate dielectric film covering a first channel region which is the first semiconductor layer between the first source region and the first drain region, and a first gate electrode formed on the first gate dielectric film and including an Hf oxide film or a Zr oxide film in which a first element selected from a first group including V, Cr, Mn, Tc and Re is added, and a second element selected from a second group including F, H and Ta is added; and a pMIS transistor including, a second source region and a second drain region, which regions are formed in the second semiconductor layer and separated from each other, a second gate dielectric film covering a second channel region which is the second semiconductor layer between the second source region and the second drain region, and a second gate electrode formed on the second gate dielectric film and including an Hf oxide film or a Zr oxide film in which the first element is added, and the second element is added in a smaller amount than that in the first gate electrode.

BRIEF DESCRIPTION OF THE DRAWINGS

FIG. 1 shows an energy band of an oxide electrode of a $TiO_2$ base;

FIG. 2 explains a level generated in a gap at the time of adding a high valence substance to $HfO_2$;

FIG. 3 shows an insertion effect of an interfacial state at an insulator/metal interface;

FIG. 4 explains a level generated in the gap at the time of adding high valence substance W to $HfO_2$;

FIG. 5 shows a level generated in the gap at the time of adding high valence substance Mo to $HfO_2$;

FIG. 6 explains a level generated in the gap at the time of adding high valence substance V to $HfO_2$;

FIG. 7 shows a level generated in the gap at the time of adding a high valence substance which has 3d orbital electrons in $HfO_2$;

FIG. 8 explains a level generated in the gap at the time of adding a high valence substance which has 4d orbital electrons in $HfO_2$;

FIG. 9 shows the level generated in the gap at the time of adding a high valence substance which has 5d orbital electrons in $HfO_2$;

FIG. 10 shows the relationship of a band offset of a Si substrate, $HfO_2$ film and a HfSiO film;

FIG. 11 is an explanation drawing of an addition of F becoming easy by adding metal to $HfO_2$;

FIG. 12 is an explanation drawing of an addition of N becoming easy by adding metal to $HfO_2$;

FIG. 13 is a sectional view showing the manufacturing process of the CMIS device by a first embodiment;

FIG. 14 is a sectional view showing a manufacturing process of the CMIS device by the second and third modifications of a first embodiment;

FIG. 15 is a perspective view of a Fin type MISFET by the fourth modification of a first embodiment;

FIG. 16 is a side view of the Fin type MISFET shown in FIG. 15;

FIG. 17 is a top view of the Fin type MISFET shown in FIG. 15;

FIG. 18 is a sectional view showing the manufacturing process of the CMIS device by a second embodiment; and FIG. 19 is a sectional view showing the manufacturing process of the CMIS device by a third embodiment.

DETAILED DESCRIPTION

First, as the related art explained, a thin $SiO_2$ film is promoted with a thickness below 1 nm. For this reason, a gate leakage current becomes large when a $SiO_2$ film having a film thickness 1 nm or less is used, standby power dissipates, and power dissipation cannot be pressed down. For example, a gate leakage current of a $SiO_2$ film having a 0.8 nm film thickness could be 1 $kA/cm^2$. So, this is a very large problem in terms of power dissipation.

In order to reduce power dissipation, it is effective to increase film thickness. For this reason, the use of a substance with a high dielectric constant (high-k dielectric) has been examined. Even if it is thicker than a $SiO_2$ film, the high-k dielectric can secure charge quantity. Many metal oxides are known as high-k dielectrics having a high dielectric constant and being stable.

Examples of insulating films which have such characteristics include: $HfO_2$, $ZrO_2$, silicates thereof (HfSiO, ZrSiO), and nitrides thereof (HfON, ZrON, HfSiON, ZrSiON), etc.

However, if these insulating films are used as a gate dielectric film, the problem that a low threshold is not acquired will occur.

For interfacial polarization to occur near the interface of a gate dielectric film and a gate electrode, pinning of the effective work function is carried out near the mid gap of Si, and it is difficult to realize a low threshold. The issue pertains to the charge transfer between an oxygen defect and a gate electrode in a p channel MIS transistor (henceforth a pMIS transistor). In an n channel MIS transistor (henceforth a nMIS transistor), the issue pertains to the charge transfer between excessive oxygen in an insulating film and a gate electrode.

In order to solve this problem, literature 1 (M. Kadoshima et al., 2007 VLSI Technology Digest P 66.) and literature 2 (P. Sivasubramani et al., 2007 VLSI Technology Digest P 68.) propose that Al be diffused in a gate dielectric film with a pMIS transistor, and La is diffused in a gate dielectric film with a nMIS transistor, and pinning positions be changed. In literature 1 and literature 2, the polarization is fixed in the interface of $SiO_2$ film and metallic oxide film and in the lamination structure of a Si substrate/$SiO_2$ film/metallic oxide film. For this reason, a lower dielectric constant film, $SiO_2$, is indispensable. That is, when the gate dielectric film becomes thin so that the low dielectric constant film, such as $SiO_2$, cannot be introduced, this art can be considered deficient.

As already stated, when patent document 1 was used, the work function of the created metal was not at an optimum value. Since the oxide electrode of a Ti base has a low stability as compared with the oxide of a Hf base or a Zr base, a possibility of giving oxygen to a gate dielectric film becomes high, and the effective work function of the metal electrode for nMIS transistors becomes a large value.

For this reason, in order to fulfill the performance, such as low threshold operation, demanded in the next generation CMIS (Complementary-Metal-Insulator-Semiconductor) transistor, an effective work function is desired.

As a result of the inventors' efforts, it became possible to obtain the semiconductor device provided with the MIS transistor which has the effective work function being, as much as possible, suitable for low threshold operation. This is explained taking the case of the following embodiments.

Hereafter, with reference to the drawings, the embodiments are described in detail.

First, control of the effective work function used for one embodiment is explained.

The energy band of the oxide electrode of a $TiO_2$ base is shown in FIG. 1, and the energy band of the oxide electrode of a $HfO_2$ base is shown in FIG. 2. The horizontal axis of FIGS. 1 and 2 shows a density of states, and a vertical axis shows energy. As shown in FIG. 1, in the $TiO_2$ base, an adjustment of an effective work function is possible, only by using one kind of additive. This is because the conduction band minimum of $TiO_2$ is in agreement with that of Si.

As shown in FIG. 2, if the high valence substance from V-valent to a VII-valent is introduced as a first additive into $HfO_2$, it is possible to create a gap state A, B, or C, that is, the band in which the energy level carried out the interaction and had narrow small distribution of width is formed. It is possible to change the energy position of gap state A, B or C to other energy positions (for example, position of 4.05 eV of FIG. 2, etc.) of a request, by introducing second additives, such as N and F. That is, if the first additive including a high valence substance, and second additives, such as N and F, are controlled artificially, the thin film of an oxide with a desired work function can be created. In FIG. 2, a center value of 4.05 eV of an effective work function with optimal nMIS transistor is shown, and a center value of 5.17 eV of the effective work function with optimal pMIS transistor is shown.

The energy gap of Si is positioned in FIG. 1 and FIG. 2. If an oxide metal with the work function near the conduction band minimum of Si can be created, it can be used as a gate metal for a nMIS transistor. A resulting work function will be 3.85 eV or more and 4.25 eV or less. At this time, it is possible to suppress threshold voltage to about 0.2 eV. If the thin film is inserted between a gate dielectric film and a gate metal, a big interfacial state can be made in the work function position of a nMIS transistor. This interfacial state results in strongly pinning the Fermi level on the position of the interfacial state. This thin film will be called an interface control oxide film in this specification. If this interface control oxide film is thin enough, a small quantity of an additional metal is available, since it is not necessary that this interface control oxide film be metal. Thus, the gate dielectric film/gate metal structure for nMIS transistor can be designed.

Next, control of the work function by an interface control oxide film is explained with reference to FIGS. 3A and 3B. The situation of Fermi level pinning by an interfacial state is shown in FIG. 3A. If the interface of an insulator and a metal has an interfacial state, an electron can go in and out via an interfacial state, and a work function of the contact metal can draw toward an energy level of an interfacial state. This phenomenon is called Fermi level pinning (based on interfacial state). In the case of metal A shown in FIG. 3, an electron flows into an interfacial state from the metal side, and the energy level of metal A falls. As a result, the effective work function of metal A becomes large.

It is reversed in the case of metal B. An electron moves to the metal B side from an interfacial state, and the energy level of metal B goes up. As a result, the effective work function of metal B becomes small. As a result, as shown in FIG. 3B, an effective work function will be determined by the energy position of an interfacial state, without being dependent on the contact metal. 'Eg' in FIGS. 3A and 3B shows an example of the energy gap of the insulator.

According to one embodiment, the effective work function is optimized by adjusting the energy level of the interfacial state. And the interfacial state is artificially induced with the interface oxide thin film.

Similarly, in the lamination structure, gate dielectric film/ gate metal of a pMIS transistor, an oxide metal is used as a gate electrode of a pMIS transistor by creating the work function near the valence band maximum of Si. This work function is not less than 4.97 eV and is 5.37 eV or less. At this time, it is possible to suppress threshold voltage to about 0.2 eV.

Next, the additive amount of a high valence substance is explained.

First, the conditions of metallization at the time of introducing an additive are explained. If one or more additives are introduced into a 2a×2a×2a unit when a lattice constant is set to a, an originally insulated $HfO_2$ becomes metallic by the interaction of additives. This will be set to $1 \times 10^{14}$ atoms/cm$^2$ in area density. When a band structure is considered at this time, as shown, for example, in FIG. 4, the band (narrow and small dispersive band) which have the wide level in a gap and the small distribution with a narrow band will be generated. Since additives cannot be added over $8 \times 10^{14}$ atoms/cm$^2$, it serves as the maximum.

The condition to which a metallic level appears in a gap is that the area density of an additive is $1 \times 10^4$ atoms/cm$^2$ or more and $8 \times 10^{14}$ atoms/cm$^2$ or less. The film in which the additive was added can serve as a control metal as it is. That is, it is possible to make it function as both an interface control oxide film and a gate metal. If this thin-metal film is inserted in an interface with a gate dielectric film/gate electrode, the thin film introduces the interfacial state, and it is possible to pin the Fermi level.

If the oxide film for controlling an interface is a thin film, metallization is not necessarily required. Since pinning of a Fermi level should just be made, one state per field of the size of 8a×8a causes enough pinning effects. Therefore, it is set to $6 \times 10^{12}$ atoms/cm$^2$ or more. In this case, if the physical film thickness of $HfO_2$ exceeds 2 nm, an Equivalent Oxide Thickness (EOT) becomes thick. Therefore, when not having metallized, a film thickness of 2 nm or less is suitable. The one or more additive per field of the size of 2a×2a makes the film metallized (hopping conduction is possible) and the restriction of the film thickness is lost. Therefore, if it becomes $1 \times 10^{14}$ atoms/cm$^2$ or more, the film thickness restrictions will be lost.

Although a level appears in a gap, an oxide film does not show metallicity.

Such a condition is that the area density of an additive is $6 \times 10^{12}$ atoms/cm$^2$ or more and $1 \times 10^{14}$ atoms/cm$^2$ or less. If the thin film of an oxide film with this gap state is inserted in the interface of a gate dielectric film and a gate electrode, it is possible for the thin film to introduce the interfacial state and to carry out pinning of the Fermi level.

As mentioned above, an energy level can be created in a band gap by adding a high valence substance. However, the energy level in this gap does not necessarily appear in the optimal position. The present inventors have developed a method of artificially repositioning an energy level up and/or down. If an excessive electron is introduced into the level in a gap, the electron correlation energy will go up, and a level will go up. Introducing an electron is possible by introducing a substance, i.e., Ta, which has a greater electron affinity when compared with Hf, and forms a conduction band at the time of substituting Hf. Alternatively, the substance which does not easily receive an electron when compared with oxygen, can be replaced by oxygen site. It means that an electron will remain and, as a result, an electron will be introduced into the energy level in a gap. F and H can be considered as substances that make this introduction possible. The substance with the easiest introduction is H (hydrogen). For example, atomic hydrogen can be taken in by exposure to low-temperature plasma hydrogen or excitation hydrogen.

Usually, atomic hydrogen will be taken in an oxide via an oxygen defect, etc. However, since there are very few amounts of oxygen defects in these embodiments, taking in of hydrogen through an oxygen defect does not happen. In one embodiment, the high valence substance is making the level in the gap, and hydrogen on lattice point can be stabilized by emitting an electron to the level. For this reason, hydrogen will be taken in the oxide film with the high valence substance. That is, in one embodiment, hydrogen will not be taken in an other gate dielectric film and all that, although hydrogen is taken in the oxide film with the high valence substance.

The conventional FGA (forming gas annealing), i.e., $H_2$ gas annealing is also considered. At this time, most hydrogen is not taken in a gate dielectric film and the oxide film with high valence substance of one embodiment. Since $H_2$ is stable as a molecule, $H_2$ is not taken in the usual oxide film. Furthermore, even if it can emit an electron to the added high valence substance, there is not sufficient energy gain like undergoing dissociation of a hydrogen molecule.

Emitting electrons from the energy level makes the energy level fall, since electron correlation energy decreases. In order to make an electron emit from the energy level, a valence band should be the state of receiving the electron. In Hf, four electrons are emitted, but if there is little electron emission compared with Hf, an electron will be insufficient as a result. In that case, electrons will be emitted from the energy level in a gap. The substance of an III valent and II valent fulfills this condition. That is, they are Mg, Ca, Sr, Ba, Al, Sc, Y, La, Ce, Pr, Nd, Pm, Sm, Eu, Gd, Tb, Dy, Ho, Er, Tm, Yb, and Lu. Alternatively, in a case where a substance that receives a lot of electrons compared with oxygen is replaced by oxygen, an electron will be received from the energy level in a gap as a result. As substances in which this is possible, there are N, C and B.

Next, the optimum value of an effective work function is explained, by reference to FIGS. 2, 4, 5 and 6. According to one embodiment, the art of designing the oxide metal which has the optimal work function for each nMIS transistor and pMIS transistor and has a narrow band in a gap is indicated.

As shown in FIG. 2, if a high valence substance is added in $HfO_2$, an energy level will appear in the gap of $HfO_2$. When the appearing energy level comes out above the conduction band minimum of Si (4.05 eV), a work function is small, and the case is defined as Type-A. The case where it comes out in the gap of Si is defined as Type-B. When coming out below the valence band maximum of Si, the case where a work function is large is defined as Type-C. The example of Type-A is shown in FIG. 4, the example of Type-B is shown in FIG. 5 and the example of Type-C is shown in FIG. 6.

Respectively, examples where W, Mo and V are added are described.

The case of Type-B where Mo is added in a dielectric oxide made of $HfO_2$ (also the same in $ZrO_2$, Hf silicate or Zr silicate) is described with reference to FIG. 5. A band offset between $HfO_2$ and Si is about 1.5 eV toward the conduction band side. Also, since a band gap of Si is 1.1 eV, and a band gap of $HfO_2$ is 6.0 eV, a band offset between $HfO_2$ and Si is 3.4 eV (=6.0−(1.5+1.1)) on the valence band side. When Mo is added in $HfO_2$, oxygen is coordinated in the surroundings of Mo. At that time, the level within the gap is formed of d orbital electrons of the added substance. The d orbital is composed of double-degenerated $d_{z2}$ orbit and $d_{x2-y2}$ orbit. The electron is possibly buried on this orbit in the number of four at maximum per the additive. A difference between the number of electrons contained in the outermost shell of the additive Mo and the number of electrons (four) in the outermost shell of Hf is contained in the level within the gap. For example, Mo has six electrons in the outermost shell. Four of the six electrons are transferred into $HfO_2$, and two of them (6−4=2) remain. Such remaining electrons are contained in the level of Mo appearing in the gap of $HfO_2$. That is, a gap level derived from Mo appears in the $HfO_2$ band gap. This gap level organizes a narrow band due to an interaction of Mo. In this way, a metal oxide (i.e., metal oxide made of $HfO_2$ having Mo added therein) can be formed by the addition of Mo in $HfO_2$. Since the work function is determined by the appearing level, it will be about 4.75 eV.

Here, when nitrogen (N) is further introduced, it is possible to emit an electron from the level of Mo. When nitrogen is introduced, oxygen will be substituted. Since nitrogen is much more able to receive an electron as compared with oxygen, it receives the electron from Mo, whereby the film is stabilized. As a result, the amount of the electron within the level of Mo decreases. When the amount of the electron decreases, the interaction between the electrons with each other is reduced, and therefore, the level falls. As shown in FIG. 5, it has been noted that when about one nitrogen element is introduced relative to four Mo elements (in a state that about ¾ of the second state is filled), a metal oxide having a work function in the vicinity of 5.1 eV is formed. Namely, it has been noted that by regulating the amount of nitrogen, it is possible to regulate the work function. According to this, it may be considered that a gate metal for pMIS transistors has been obtained.

Since nitrogen receives an electron, it will be called an electron-accepting substance in this specification. The electron-accepting substance is not limited to nitrogen. As the substance capable of substituting oxygen therewith, carbon (C) and boron (B) have the same characteristics. In one embodiment, an oxide of Hf or Zr is considered. When Mg, Ca, Sr, Ba, Al, Sc, Y, La or a lanthanoid (for example, Ce, Pr, Nd, Pm, Sm, Eu, Gd, Tb, Dy, Ho, Er, Tm, Yb, Lu) is substituted with Hf or Zr, the same properties are revealed. This is because, since the valence is small, such an element cannot emit an electron as compared with Hf or Zr, and therefore, oxygen is able to consequently receive an electron from others (Mo when FIG. 5 is concerned).

In the foregoing simultaneous addition of Mo and N, a gate metal of a pMIS transistor was obtained. The case where fluorine (F) is introduced as an additive in place of N is considered. In that case, by injecting an electron into an in-gap level, the level can be raised, and it is possible to design a metal oxide having an optimal work function for nMIS transistors. When fluorine is introduced, oxygen is substituted. Since fluorine is able to receive an electron as compared with oxygen, an electron which Hf has emitted remains. By transferring this remaining electron into the in-gap level that Mo has formed, the film is stabilized. As a result, the electron within the level of Mo increases; and the level arises. As shown in FIG. 5, it has been noted that when about one fluorine element is introduced relative to three Mo elements (in a state that about ⅓ of the third state is filled), a metal oxide having a work function in the vicinity of 4.1 eV is formed. Namely, it has been noted that by regulating the amount of fluorine, it is possible to regulate the work function.

Since fluorine emits an electron, it will be called an electron-emitting substance in this specification. There are only a few electron-emitting substances. Fluorine is the most effective substance. Also, the easiest substance for introduction is hydrogen. In one embodiment, an oxide of Hf or Zr is considered. When tantalum (Ta) is substituted with Hf or Zr, there may be the case where the same properties are exhibited. This is because, since the valence is large, it is possible to emit an electron much more as compared with Hf or Zr. Namely, fluorine, hydrogen and Ta may be considered as the electron-emitting substance.

Type-B as shown in FIG. 5 is an example wherein an energy level is produced in an Si gap by the addition of a metal. In order to shift this level in an upper direction, an electron may be introduced by adding F or the like. Inversely, in order to shift this level in a lower direction, an electron may be taken out by adding N or the like. Here, a film for nMOS transistors may be prepared by preparing an Mo-added HfON film but not an Mo-added $HfO_2$ film as an initial film, preparing a film in which the level of the additive (Mo) is shifted in a lower direction to form a film for pMOS transistors and then introducing F or the like thereinto. In that case, an electron will be introduced much more in proportion to one which has been shifted downward in the initial film. Inversely, a film for pMOS transistors may be prepared by preparing an Mo-added HfOF film as an initial film to form a film for nMOS transistors and then introducing N thereinto. In that case, an electron will be taken away much more in proportion to one which has been shifted upward in the initial film.

In Type-A as shown in FIG. 4, when tungsten (W) is added in $HfO_2$, an in-gap level appears, and a narrow in-gap band is produced due to an interaction of W. Since the work function is determined by the appearing energy level, it will be about 3.9 eV. Here, when nitrogen is further introduced, it is possible to emit an electron from the level of W. As a result, the electron within the energy level of W decreases; and the energy level falls. As shown in FIG. 4, when about one nitrogen element is introduced relative to four W elements (in a state that about ¾ of the second state is filled), a metal oxide having a work function in the vicinity of 4.1 eV is formed, whereby a metal for nMIS transistors is formed. Furthermore, when about one nitrogen element is introduced relative to three W elements (in a state that about ⅔ of the second state is filled), a metal oxide having a work function in the vicinity of 5.1 eV is formed, whereby a metal for pMIS transistors is formed. Namely, it has been noted that by regulating the amount of nitrogen, it is possible to regulate the work function.

In Type-C as shown in FIG. 6, when vanadium (V) is added in $HfO_2$, an in-gap level appears, and a narrow in-gap band is produced due to an interaction of V. Since the work function is determined by the appearing level, it will be about 6.2 eV. Here, when fluorine is further introduced, it is possible to introduce an electron into the level of V. As a result, the electron within the level of V increases, and the level arises. As shown in FIG. 6, when about two fluorine elements are introduced relative to three V elements (in a state that about ⅔ of the second state is filled), a metal oxide having a work function in the vicinity of 5.1 eV is formed, whereby a metal for pMIS transistors is formed. Furthermore, when about one fluorine element is introduced relative to one V element (in a state that the second state is filled), a metal oxide having a work function in the vicinity of 4.1 eV is formed, whereby a metal for nMIS transistors is formed. Namely, it has been noted that by regulating the amount of fluorine, it is possible to regulate the work function.

FIG. 7, FIG. 8 and FIG. 9 show an in-gap level in the case where 3d orbital, 4d orbital and 5d orbital elements are introduced into $HfO_2$, respectively. Such a level is a calculated result according to the first-principles calculation. As to $ZrO_2$, the same result as in $HfO_2$ is obtained. The first-principles calculation is a method on the basis of the density functional theory and is a calculation of the range of local density approximation. For the potential, an ultra-soft preudopotential is employed. Potentials of Hf, O, N, F and the like which are employed in this calculation have already been used in various forms and are high in reliability. For example, a lattice constant of $HfO_2$ obtained by the calculation ($a_0$=9.55 Bohr=5.052 angstrom) appears short only by about 0.55% as compared with an experimental value ($a_0$=9.603 Bohr=5.08 angstrom), and therefore, it may be said that it is sufficient.

FIG. 7 shows an example of the case of adding each of V, Cr and Mn as a 3d orbital element in $HfO_2$. All of the cases of adding the 3d orbital element in $HfO_2$ become Type-C, and when only the 3d orbital element is added, an appropriate effective work function cannot be obtained. When V, Cr and Mn are added, respectively, the level appears at a position of 6.2 eV, 7.2 eV and 8.1 eV, respectively. In order to obtain an appropriate effective work function, it is necessary to inject an electron by the addition of an element such as F.

FIG. 8 shows an example of the case of adding each of Nb, Mo and Tc as a 4d orbital element in $HfO_2$. The case of adding Nb is of Type-A, and in order to obtain an appropriate effective work function, it is necessary to take away an electron by the addition of an element such as N. The case of adding Mo is of Type-B, and it is necessary to obtain an appropriate effective work function for nMIS transistors or pMIS transistors by the addition of F, etc., or N, etc. The case of adding Tc is of Type-C, and in order to obtain an appropriate effective work function, it is necessary to inject an electron by the addition of an element such as F. When Nb, Mo and Tc are added, respectively, the level appears at a position of 3.3 eV, 4.75 eV and 7.3 eV, respectively.

FIG. 9 shows an example of the case of adding each of Ta, W and Re as a 5d orbital element in $HfO_2$. In the case of adding Ta, the level exists in the conduction band of $HfO_2$. That is, Ta can be considered to be an electron-supplying substance. The case of adding W is of Type-A, and in order to obtain an appropriate effective work function, it is necessary to emit an electron by the addition of an element such as N. The case of adding Re is of Type-C, and in order to obtain an appropriate effective work function, it is necessary to inject an electron by the addition of an element such as F. When W and Re are added, respectively, the level appears at a position of 3.9 eV and 5.3 eV, respectively.

Also, as shown in FIG. 10, the relationship with the gap position of Si is also the same in the silicate. That is, as to the silicate, since an interaction between Si and oxygen is added, the conduction band minimum of $HfO_2(ZrO_2)$ arises, and the valence electron band maximum falls. However, the positional relationship with Si of the in-gap level to be generated by the addition of a metal does not change. In FIG. 10, Eg(Si) represents an energy gap of Si; $Eg(HfO_2)$ represents an energy gap of $HfO_2$; and Eg(HfSiO) represents an energy gap of HfSiO.

In order to make $HfO_2(ZrO_2)$ and its silicate have a level in the vicinity of 4.1 eV as an optimal value of nMIS and in the vicinity of 5.1 eV as an optimal value of pMIS, respectively, it is possible to achieve the regulation by emitting an electron by the addition of N, etc., or injecting an electron by the addition of F, etc.

Next, the reason why F, etc., or N, etc., is introduced into $HfO_2$ more easily as compared with the conventional case is described with reference to FIG. 11A to FIG. 12C. The reason resides in stabilization of energy that an electron has. First of all, the case of adding F is described. As shown in FIG. 11A, when F is simply introduced, an excessive electron is introduced into the conduction band minimum, and therefore, the energy state becomes high. However, when a metal is introduced as the additive, the electron is transferred into a lower energy level to be generated by the added metal (FIG. 11B), whereby the excessive electron by the addition of F is transferred (FIG. 11C). According to this, since the energy of the whole of the system falls, F is introduced more easily as compared with the conventional case.

As to taking in of Ta, F and H, it is possible to selectively concentrate it in a region of an oxide film having a high valence substance added therein. This is because it is possible to transfer an electron into the high valence substance in a region where the high valence substance exists rather than diffusion into an other region, and therefore, an energy gain is obtainable in proportion thereto.

On the other hand, in the case of adding N, the electron is insufficient this time. This insufficient electron will produce a hole of an electron in the valence band maximum (FIG. 12A). Usually, oxygen with a minus charge is emitted to procure an electron. However, when a metal additive is introduced, it is possible to procure an electron from the energy level (FIG. 12B) formed by the metal additive (FIG. 12C). At that time, the position of the hole of an electron by the addition of N is lower than the position of the level of the metal from the energy standpoint. By this procurement of an electron, the energy of the whole of the system falls, whereby N is introduced more easily as compared with the conventional case.

As to taking in of Mg, Ca, Sr, Ba, Al, Sc, Y, La, Ce, Pr, Nd, Pm, Sm, Eu, Gd, Tb, Dy, Ho, Er, Tm, Yb, Lu, N, C and B, it is possible to selectively concentrate it in a region of an oxide film having a high valence substance added therein. This is because it is possible to receive an electron from the high valence substance in a region where the high valence substance exists rather than diffusion into an other region, and therefore, an energy gain is obtainable in proportion thereto.

Examples of a method for introducing the additive which may be considered include a method by ion injection; a method of thermal diffusion by fabrication; a method of introduction from the atmosphere at the time of fabrication; a method of introduction as a fabricating gas by CVD (chemical vapor deposition) or ALD (atomic layer deposition); a method of introduction as a target for sputtering; and a method of injection into a substrate or a side wall or the like and diffusion in a subsequent thermal process. In particular, it is possible to introduce even F or N into an Si substrate, thereby introducing an interfacial control oxide film by means of a thermal process. As described previously, since F or N is easy to enter the interfacial oxide film, it is possible to pass it therethrough the substrate or gate dielectric film, thereby introducing selectively and predominantly into the interfacial control oxide film.

Also, as to the silicates of $HfO_2$ and $ZrO_2$ (i.e., HfSiO and ZrSiO), when nitrogen is added, an $Si_3N_4$ structure has had preference so far. Namely, nitrogen is not introduced into $HfO_2$, but an Si—N bond has preference. However, as described previously, when a metal additive is introduced, the energy falls by the introduction of nitrogen into the $HfO_2$ side, and therefore, the metal additive will be introduced into the $HfO_2$ side. Namely, an Hf—N bond has preference. According to this, it has been noted that it is also possible to adjust the level by nitrogen (or the like) on the silicate.

Next, the relative amount of a second additive is described.

First of all, a relative amount of an additive such as N in the case of Type-A is described.

The addition amount $[\beta]$ (atom/$cm^2$) of an element $\beta$ selected among N, C, B, Mg, Ca, Sr, Ba, Al, Sc, Y, La, Ce, Pr, Nd, Pm, Sm, Eu, Gd, Tb, Dy, Ho, Er, Tm, Yb and Lu relative to the addition amount $[\alpha]$ (atom/$cm^2$) of an element $\alpha$ selected from Nb and W is satisfied with the following expression (1):

$$0.08 \times [\alpha] < [\beta] \times K < [\alpha] \times ([\text{Number of electrons in the outermost shell of the element } \alpha]-4) \quad (1)$$

Here, the number of electrons in the outermost shell of the element $\alpha$ is 5 for Nb and 6 for W, respectively. Also, as to K, when the element $\beta$ is N, then K is 1; when the element $\beta$ is C, then K is 2; when the element $\beta$ is B, then K is 3; when the element $\beta$ is Mg, Ca, Sr or Ba, then K is 2; and when the element $\beta$ is Al, Sc, Y, La, Ce, Pr, Nd, Pm, Sm, Eu, Gd, Tb, Dy, Ho, Er, Tm, Yb or Lu, then K is 1. When the element $\beta$ is N, C and B, respectively, the number of electrons in the outermost shell is insufficient by 1, 2 and 3, respectively as compared with oxygen (O). For that reason, the number of electrons which the element $\beta$ to be added receives in the case of substitution with oxygen is 1, 2 and 3, respectively, and such a value will become K. Also, when the element $\beta$ is Mg, Ca, Sr or Ba, since the element $\beta$ is II valent, the number of electrons to be emitted is small by 2 as compared with IV valent hafnium (Hf). For that reason, in the case where the element $\beta$ is added, since two holes are formed in an upper end of the valence electron band, the upper end of the valence electron band is able to receive two electrons, and this value will become K. That is, when the element $\beta$ is Mg, Ca, Sr or Ba, then K will become the number of electrons which the upper end of the valence electron band is able to receive. Also, when the element $\beta$ is Al, Sc, Y, La, Ce, Pr, Nd, Pm, Sm, Eu, Gd, Tb, Dy, Ho, Er, Tm, Yb or Lu, the element $\beta$ is III valent. Thus, similarly, in the case where the element $\beta$ is added, the number of electrons which an upper end of the valence electron band is able to receive is one, and this value will become K. Therefore, $([\beta] \times K)$ is the amount of electrons which can be received by the addition of the element $\beta$. A relative upper limit value is determined by the matter that the electrons can be emitted only in an amount of up to {[number of electrons in the outermost shell of the element $\alpha$]−4} from the level formed by the element $\alpha$.

Also, the {[number of electrons in the outermost shell of the element $\alpha$]−4} is the number of electrons which can be emitted from the first additive. As the lower limit, the relationship of $0.08 \times [\alpha] < [\beta] \times K$ may be considered. This is because an effect of electron correlation is not visualized unless, when the effect of electron emission (falling of the level position) is started to be found, the amount reaches an extent that electrons enter the position of the Hf atom in the surroundings of the position of one Hf atom, namely an extent of $1/12=0.083$ because 12 Hf atoms at maximum exist in the surroundings.

$HfO_2$ takes a structure of calcium fluoride of a cubic crystal as a basic structure. According to this basic structure, 8 oxygen atoms exist in the vicinity of the Hf atom, and 12 Hf atoms exist in the outside thereof. Basically, the number of Hf atoms in the surroundings is 12 at maximum. Even when $HfO_2$ takes a tetragonal crystal or monoclinic structure or an amorphous structure, the basis of the electron state does not substantially change from the standpoints that the conduction band is formed of a 5d orbital component of Hf and that the valence band is formed of a 2p orbital component of oxygen.

In the foregoing description, while one kind of an element has been added as the first element $\alpha$, two kinds of elements may be added as the first element. In that case, the addition amount $[\alpha]$ is the sum of the elements to be added. Also, while one kind of an element has been added as the second element $\beta$, two or more kinds of elements may be added as the second element. In that case, $(\beta \times K)$ expressed in the expression (1) is the sum of the products of the addition amount of the second element to be added and K. For example, when the second elements to be added are the kinds of $\beta_1$ and $\beta_2$, and the values of K corresponding thereto are $K_1$ and $K_2$, $(\beta \times K)$ expressed in the expression (1) will become $[\beta_1] \times K_1 + [\beta_2] \times K_2$. This matter is similarly applicable to the cases as described below. Also, in order to obtain the effect of one embodiment by the addition of the additive, as described previously, when the area density of the additive is less than $6 \times 10^{12}$ atoms/$cm^2$, enough amount of a level for pinning of the Fermi level is not generated in the gap. That is, the amount of the additive is required to be at least $4.8\times10^{11}$ atoms/cm$^2$ (=$0.08\times6\times10^{12}$ atoms/cm$^2$). In the case where the area density of the additive is less than $4.8\times10^{11}$ atoms/cm$^2$, the additives can be considered as impurities.

Next, the relative amount of an additive such as N and F in the case of Type-B is described.

In relation with the addition amount [Mo] (atom/cm$^2$) of Mo to be added in HfO$_2$, F, H or Ta is added in preparing an nMOS transistor; and N or the like is added in preparing a pMOS transistor.

The addition amount [γ] (atom/cm$^2$) of a first element γ selected among F, H and Ta is satisfied with the following expression (2):

$$0.08\times[Mo]<[\gamma]<[Mo]\times2 \quad (2)$$

and the addition amount [δ] (atom/cm$^2$) of a second element δ selected among N, C, B, Mg, Ca, Sr, Ba, Al, Sc, Y, La, Ce, Pr, Nd, Pm, Sm, Eu, Gd, Tb, Dy, Ho, Er, Tm, Yb and Lu is satisfied with the following expression (3):

$$0.08\times[Mo]<[\delta]\times K<[Mo]\times2 \quad (3)$$

Since the number of electrons in the outermost shell of Mo is 6, an upper limit of the nMOS transistor side will be the case of receiving up to the number of (amount of Mo)×2; and an upper limit of the pMOS transistor side will be the case of emitting up to number of (amount of Mo)×2. Here, K is the number of electrons which can be received by the addition of the second element δ. When the second element δ is N, then K is 1; when the second element δ is C, then K is 2; when the second element δ is B, then K is 3; when the second element δ is Mg, Ca, Sr or Ba, then K is 2; and when the second element δ is Al, Sc, Y, La, Ce, Pr, Nd, Pm, Sm, Eu, Gd, Tb, Dy, Ho, Er, Tm, Yb or Lu, then K is 1.

Also, in forming a CMIS device of Type-B, namely a CMIS device in which, for example, Mo is added, in the case where the second element such as nitrogen (N) is added in both the nMIS transistor and the pMIS transistor, a pMIS transistor to be used as an interfacial control oxide film or a gate electrode is prepared by adding N in a first oxide film of the nMIS transistor and a second oxide film of the pMIS transistor. Thereafter, an nMOS transistor to be used as an interfacial control oxide film or a gate electrode is prepared by adding the first element such as F only in the first oxide film.

In that case, in relation with the addition amount [Mo] (atom/cm$^2$) of Mo, the addition amount [γ] (atom/cm$^2$) of a first element γ (for example, F, H or Ta) and the addition amount [δ] (atom/cm$^2$) of a second element δ (for example, N, etc.) satisfy the following expressions (4) and (5):

$$0.08\times[Mo]<[\gamma]<[Mo]\times2+[\delta]\times K \quad (4)$$

$$0.08\times[Mo]<[\delta]\times K<[Mo]\times2 \quad (5)$$

Here, K is the number of electrons which can be received by the addition of the second element δ. In the expression (4), a lower limit is the same as in the expression (2), and an upper limit reflects the matter that the amount of an electron which Mo is able to receive increases. Also, the expression (5) has the same contents as in the expression (3).

Next, in forming a CMIS device of Type-B, namely a CMIS device in which, for example, Mo is added, in the case where the first element such as fluorine (F) is added in both the nMIS transistor and the pMIS transistor, an nMIS transistor to be used as an interfacial control oxide film or a gate electrode is prepared by adding F in a first oxide film of the nMIS transistor and a second oxide film of the pMIS transistor. Thereafter, a pMOS transistor to be used as an interfacial control oxide film or a gate electrode is prepared by adding the first element such as N only in the second oxide film.

In that case, in relation with the addition amount [Mo] (atom/cm$^2$) of Mo, the addition amount [∈] (atom/cm$^2$) of a first element ∈ (for example, F, H or Ta) and the addition amount [ξ] (atom/cm$^2$) of a second element ξ (for example, N, etc.) satisfy the following expressions (4) and (5):

$$0.08\times[Mo]<[\in]<[Mo]\times2 \quad (6)$$

$$0.08\times[Mo]<[\xi]\times K<[Mo]\times2+[\in] \quad (7)$$

Here, K is the number of electrons which can be received by the addition of the second element ξ. In the case of adding F, since F emits only one electron, the expression (6) has the same contents as in the case of K=1 in the expression (2). Also, in the expression (7), a lower limit is the same as in the expression (2), and an upper limit reflects the matter that the amount of an electron which Mo is able to emit increases.

Next, the relative amount of an additive such as F in the case of Type-C is described.

In relation with the addition amount [η] (atom/cm$^2$) of a first element η which is an additive metal, the addition amount [θ] (atom/cm$^2$) of a second element θ selected among F, H and Ta is satisfied with the following expression (8):

$$0.08\times[\eta]<[\theta]\times[\eta]\times(8-[\text{Number of electrons in the outermost shell of the first element }\eta]) \quad (8)$$

Here, the number of electrons in the outermost shell of the first element η is 5 for V, 6 for Cr and 7 for Mn, Tc or Re, respectively.

First Embodiment

Next, a semiconductor device according to a first embodiment of the invention is described with reference to FIG. 13A to FIG. 13C.

The semiconductor device according to this embodiment includes an nMIS transistor and a pMIS transistor formed on a silicon substrate, and these MIS transistors are of the foregoing Type-A. Steps of manufacturing the semiconductor device of this embodiment are shown in FIG. 13A to FIG. 13C. The semiconductor according to this embodiment is formed in the following manner.

First of all FIG. 13A shows a device separating region 4 for separating a pMIS transistor forming region and an nMIS transistor forming region from each other on a semiconductor substrate, for example, a silicon substrate 2. This device separating region 4 is formed by means of, for example, an STI (shallow trench isolation) technology. This device separating region can also be formed by means of an LOCOS (local oxidation of silicon) technology.

Thereafter, a p-well 6 is formed in the nMIS transistor forming region, and an n-well 8 is formed in the pMIS transistor forming region (FIG. 13A). Subsequently, in order to regulate the threshold voltage, impurities are introduced into the p-well 6 and the n-well 8. For the formation of these p-well 6 and n-well 8, for example, an ion injection method using a mask provided with an opening only on each of the regions can be adopted.

Next, as shown in FIG. 13A, a gate dielectric film 10 is formed on the silicon substrate 2. This gate dielectric film 10 was formed by depositing a hafnium oxide (HfO$_2$) film having a thickness of 3 nm at a temperature of the silicon substrate 2 of 400° C. by means of a sputtering method. Here, fabrication is carried out by sputtering an HfO$_2$ target in Ar/O$_2$. Other high-k films such as an HfSiON film and an LaAlO$_3$ film can be used as this gate dielectric film 10. Thereafter, a 10 nm-thick hafnium oxynitride (HfON) film 12 having W added therein was deposited at a temperature of the silicon substrate 2 of 400° C. Here, fabrication is carried out by simultaneously sputtering an HfO$_2$ target and a W target in Ar/N$_2$.

Next, as shown in FIG. 13B, a photoresist is coated on the hafnium oxynitride (HfON) film 12 having W added therein, and a resist pattern 14 having an opening on the pMIS transistor forming region is formed by means of a lithography technology. Only in the pMIS transistor forming region, N (nitrogen) is introduced into the hafnium oxynitride film 12 on the pMIS transistor forming region by using this resist pattern 14 for a mask by means of an ion injection method, thereby obtaining an HfON film 12a having W added therein and having a high N concentration for pMIS transistors. Here, though the ion injection method was employed as a method of additionally introducing N, a method of laminating WN by sputtering and diffusing it by annealing or other methods are also effective.

Next, after removing the resist pattern 14, a photoresist is coated on the HfON films 12 and 12a having W added therein, and the foregoing photoresist is subjected to patterning by means of a usual lithography technology, thereby forming a resist pattern (not shown) for forming a gate electrode. By carrying out, for example, RIE (Reactive Ion Etching) using this resist pattern as a mask, the HfON films 12 and 12a and the gate dielectric film 10 are subjected to patterning, thereby obtaining the respective gate electrodes 12 and 12a (FIG. 13C). Thereafter, a CMIS device is accomplished through the preparation such as forming source/drain regions 16a and 16b of an nMIS transistor and source/drain regions 18a and 18b of a pMIS transistor.

In this embodiment, the gate electrode 12 of an nMIS transistor is HfON having W added therein. Its area density of W is $1.2 \times 10^{14}$ atoms/cm$^2$. Its nitrogen concentration is about ¼ of the area density of W, that is, $0.3 \times 10^{14}$ atoms/cm$^2$ in terms of an area density. Its work function is 4.1 eV. On the other hand, in the gate electrode 12a of a pMIS transistor, a nitrogen concentration arose and was about ⅓ of the area density of W, a value of which is $0.4 \times 10^{14}$ atoms/cm$^2$ in terms of an area density. Its work function is 5.1 eV. In this way, by using an HfON electrode having W added therein, it is possible to reduce a threshold voltage to not more than 0.4 V with respect to both the nMIS transistor and the pMIS transistor.

Here, it may be considered that each of the gate electrodes 12 and 12a serves as the interfacial control oxide film and the electrode. That is, this interface portion of the electrode works as the interfacial control oxide film. In other words, as shown in FIG. 3B, it may be considered that this interface portion of the electrode plays a role to produce an interfacial state at an optimal work function position.

First Modification of the First Embodiment

As a semiconductor device according to a first modification of the first embodiment, W or Nb was added to produce an in-gap state; and N or a substance selected among C, B, Mg, Ca, Sr, Ba, Al, Sc, Y, La and a lanthanoid (for example, Ce, Pr, Nd, Pm, Sm, Eu, Gd, Tb, Dy, Ho, Er, Tm, Yb, Lu) was introduced to optimize the in-gap state, thereby preparing an nMIS transistor and a pMIS transistor. Thus, it was confirmed that a low threshold operation could be achieved.

Second Modification of the First Embodiment

A semiconductor device according to a second modification of the first embodiment is described with reference to FIG. 14A to FIG. 14C. The semiconductor device according to this modification has a structure in which W is used as a gate electrode, and for example, a 2.5 nm-thick HfON thin film having W added therein is inserted between a gate dielectric film and the W electrode. The semiconductor device according to this embodiment is formed in the following manner.

The formation is carried out in the same manner as in the first embodiment as shown in FIG. 13A until the gate dielectric film 10 has been formed. After forming the gate dielectric film 10 made of hafnium oxide (HfO$_2$), a 2.5 nm-thick HfON thin film 13 having W added therein is formed (FIG. 14A).

Next, as shown in FIG. 14B, a photoresist is coated on the HfON thin film 13 having W added therein, and a resist pattern 14 having an opening on the pMIS transistor forming region is formed by means of a lithography technology. Only in the pMIS transistor forming region, N is introduced into the HfON thin film 13 on the pMIS transistor forming region by using this resist pattern 14 for a mask and laminating a WN film 19 and annealing it, thereby obtaining an HfON film 13a having W added therein and having a high N concentration. Here, though as a method of additionally introducing N, a method of laminating WN by sputtering and diffusing it by annealing was employed, an ion injection method or other methods are also effective.

Next, after removing the resist pattern 14, a W film 15 is deposited on the HfON thin films 13 and 13a having W added therein by means of a sputtering method. Then, this W film 15, the HfON thin films 13 and 13a and the gate dielectric film 10 are subjected to patterning, thereby forming the gate electrode 15 for each of an nMIS transistor and a pMIS transistor. That is, the nMIS transistor has a gate of a lamination structure of the gate dielectric film 10, the HfON thin film 13 having W added therein and the gate electrode 15 made of W; and the pMIS transistor has a gate of a lamination structure of the gate dielectric film 10, the HfON thin film 13a having W added therein and having a high N concentration and the gate electrode 15 made of W. Accordingly, the HfON thin films 13 and 13a are an interfacial control oxide film.

In this embodiment, the addition density of each of W and N was exactly the same as in the first embodiment. The work function is subjected to pinning at an optimal value by the 2.5 nm-thick HfON thin films 13 and 13a having W added therein, and the HfON thin films 13 and 13a having W added therein exhibit sufficient metallic properties. Thus, the resistance of each of the interfacial control oxide films 13 and 13a exhibits a usually metallic resistance characteristic. Since the electrical resistance of W is lower than that of HfON having W added therein, there is brought an effect for reducing the power dissipation. In this way, by using a laminated electrode of a metal thin film made of HfON having W added therein and a W film, it is possible to reduce the threshold voltage to not more than 0.4 V with respect to both the nMIS transistor and the pMIS transistor.

Also, since W is a substance which is excellent in processability and which has hitherto included a lot of know-how, the use of W brings about large merits in a process, too.

Third Modification of the First Embodiment

Next, a semiconductor device according to a third modification of the first embodiment is described with reference to FIG. 14A to FIG. 14C.

The semiconductor device of this modification has a structure in which in the first embodiment, W is used as a gate electrode, and a 1.5 nm-thick HfON thin film having W added therein is inserted between a gate dielectric film and the gate electrode, namely a structure as shown in FIG. 14C. Then, the semiconductor device of this modification is different from the semiconductor device of the second modification with respect to the addition density of W of each of the HfON thin films 13 and 13a. The addition density of W was lower than that in the second modification and was $1\times10^{13}$ atoms/cm². The nitrogen concentration of the nMIS transistor side was about ¼ of the area density of W, a value of which was $2.5\times10^{12}$ atoms/cm² in terms of an area density. At that time, the state appears in the inside of a gap of the gate dielectric film 10 made of HfO₂. An in-gap level was revealed at a position where it is 4.1 eV as reduced into a work function.

On the other hand, the gate electrode of the pMIS transistor increases the nitrogen concentration, a value of which is about ⅓ of the area density of W and is $3.3\times10^{12}$ atoms/cm² in terms of an area density. At that time, the state appears in the inside of a gap of the gate dielectric film 10 made of HfO₂. A level within the gap is revealed at a position where it is 5.1 eV as reduced into a work function. Namely, it is possible to consider that the subject structure is a structure in which in the gap of the gate dielectric film 10, an interfacial state is produced at the position of a work function of 4.1 eV on the nMIS transistor side, whereas an interfacial state is produced at the position of a work function of 5.1 eV on the pMIS transistor side. At that time, the effective work function of the gate electrode 15 made of W is subjected to pinning at a position of the above-produced interfacial state. In this way, when a laminated electrode of the dielectric film 10, the HfON ultra-thin film 13 or 13a having W added therein and the gate electrode 15 made of W is used, it is possible to reduce the threshold voltage to not more than 0.4 V with respect to both the nMIS transistor and the pMIS transistor. It is preferable that the HfON ultra-thin films 13 and 13a having W added therein each has a thickness of not more than 2 nm.

Fourth Modification of the First Embodiment

Next, a semiconductor device according to a fourth modification of the first embodiment is described with reference to FIG. 15 to FIG. 17. The semiconductor device according to this modification is a CMIS device provided with a Fin type nMIS transistor and a Fin type pMIS transistor, and a perspective view thereof is shown in FIG. 15. Also, a cross-sectional view when cut by a vertical plane against a substrate in the vicinity of a channel of an nMIS transistor is shown in FIG. 16; and a cross-sectional view when cut by a parallel plane against a substrate in the vicinity of a channel is shown in FIG. 17.

In the semiconductor device of this modification, a dielectric film 32 is formed on a substrate 30; and a plate-shaped silicon layer 33a for a Fin type nMIS transistor and a plate-shaped silicon layer 33b for a Fin type pMIS transistor are formed on this dielectric film 32. In the silicon layer 33a, a source region 34a and a drain region 34b for a Fin type nMIS transistor, which regions are separated from each other in a longitudinal direction, are formed. The silicon layer 33a between the source region 34a and the drain region 34b serves as a channel region 34c (FIG. 17). A gate dielectric film 36a is formed so as to cover this channel region 34c; an interfacial control oxide film 37a is formed so as to cover this gate dielectric film 36a; and a gate electrode 38a is provided so as to cover this interfacial control oxide film 37a.

Also, in the silicon layer 33b, a source region 35a and a drain region 35b for a Fin type pMIS transistor, which regions are separated from each other in a longitudinal direction, are formed. The silicon layer 33b between the source region 35a and the drain region 35b serves as a channel region (not shown). A gate dielectric film 36b is formed so as to cover this channel region; an interfacial control oxide film 37b is formed so as to cover this gate dielectric film 36b; and a gate electrode 38b is provided so as to cover this interfacial control oxide film 37b.

In this modification, while the interfacial control oxide film (e.g., 37a, 37b) has been provided between the gate dielectric film (e.g., 36a, 36b) and the gate electrode (e.g., 38a, 38b), the interfacial control oxide film may not be provided as in the first embodiment or the first modification.

In this modification, when the same materials as in any one of the first embodiment and the first to third modifications are used in the lamination structure of gate dielectric film/gate electrode or the lamination structure of gate dielectric film/interfacial control oxide film/gate electrode, it is possible to exhibit the same effects as in the first embodiment and the first to third modifications. That is, by introducing the additive, the state is produced in the gap of the interfacial control oxide film, thereby moving the energy position of this state to an optimal position by nitrogen (N) or the like. Then, it is possible to subject the effective work function of a gate metal to pinning at the moved energy position.

In the first embodiment and its modifications, a fully depleted SOI (silicon on insulator) substrate can be used in place of the silicon substrate. In that case, it is considered that an optimal work function is inclined to the central direction of the gap of Si. In that case, it is possible to control it at an optimal value by regulating the addition amount of N or the like.

Also, in the first embodiment and its modifications, a compound semiconductor substrate such as a Ge substrate and a GaAs substrate can be used in place of the silicon substrate. In that case, a CMIS device can be prepared in the same manner as in the case of the Si substrate. A difference resides only in the matter that a value of the optimal work function is deviated. For example, in the case of the Ge substrate, an optimal value for nMIS transistors is 4.0 eV; and an optimal value for pMIS transistors is 4.66 eV. For example, in preparing an interfacial control oxide film for pMIS transistors, the application is possible by decreasing the N amount. Specifically, by regulating the N amount at $0.35\times10^{14}$ atoms/cm², it is possible to prepare a CMIS device with a low threshold value relative to the Ge substrate.

Second Embodiment

Next, a semiconductor device according to a second embodiment of the invention is described with reference to FIG. 18A to FIG. 18C.

A semiconductor device according to this embodiment includes an nMIS transistor and a pMIS transistor formed on a silicon substrate, and these MIS transistors are of the foregoing Type-B. Steps of manufacturing the semiconductor device of this embodiment are shown in FIG. 18A to FIG. 18C. The semiconductor according to this embodiment is formed in the following manner.

First of all, similar to the case of the first embodiment, a device separating region 4 is formed on a silicon substrate 2 (FIG. 18A). Thereafter, a p-well 6 is formed in the nMIS transistor forming region, and an n-well 8 is formed in the pMIS transistor forming region. Subsequently, in order to regulate the threshold voltage, impurities are introduced into the p-well 6 and the n-well 8.

Next, a gate dielectric film 40 is formed on the silicon substrate 2. This gate dielectric film 40 was formed by depositing a lanthanum aluminate film (LaAlO₃ film) having a thickness of 3 nm at a temperature of the silicon substrate 2 of 400° C. by means of a sputtering method. As to the lanthanum aluminate film, fabrication is carried out by sputtering an $LaAlO_3$ target in $Ar/O_2$. Thereafter, a 10 nm-thick hafnium oxynitride film 42 having Mo added therein was deposited at a temperature of the silicon substrate 2 of 400° C. by means of a sputtering method. As to this hafnium oxynitride film 42, fabrication is carried out by simultaneously sputtering an $HfO_2$ target and an Mo target in $Ar/N_2$.

Next, as shown in FIG. 18B, a photoresist is coated on the hafnium oxynitride (HfON) film 42 having Mo added therein, and a resist pattern 44 having an opening on the nMIS transistor forming region is formed by means of a lithography technology. F is introduced into the hafnium oxynitride film 42 having Mo added therein on the nMIS transistor forming region by using this resist pattern 44 for a mask by means of an ion injection method, thereby obtaining an HfON film 42a having Mo added therein, into which F for an nMIS transistor has been introduced while utilizing thermal diffusion (FIG. 18B). Here, though the ion injection method was employed as a method of additionally introducing F, a method of laminating Ta by sputtering and diffusing it by annealing or other methods are also effective. In that case, an HfON film having Mo and Ta added therein is formed. Alternatively, annealing in an H exciting gas is effective, too. In that case, an HfONH film having Mo added therein is formed.

Next, after removing the resist pattern 44, a photoresist is coated on the HfON film 42 and the HfONF film 42a, and the foregoing photoresist is subjected to patterning by means of a usual lithography technology, thereby forming a resist pattern (not shown) for forming a gate electrode. By carrying out etching using this resist pattern as a mask, the HfON film 42 and the HfONF film 42a and the gate dielectric film 40 are subjected to patterning, thereby obtaining the respective gate electrodes. Thereafter, a CMIS device is accomplished through the preparation of source/drain regions 46a and 46b of an nMIS transistor and source/drain regions 48a and 48b of a pMIS transistor.

In this embodiment, the gate electrode of a pMIS transistor is HfON having Mo added therein and had an area density of Mo of $1.2 \times 10^{14}$ atoms/cm$^2$ and a nitrogen concentration of about ¼ of the area density of Mo, a value of which is $0.3 \times 10^{14}$ atoms/cm$^2$ in terms of an area density. Its work function is 5.1 eV.

On the other hand, in the gate electrode of an nMIS transistor, F was added, and it had an area density of $0.7 \times 10^{14}$ atoms/cm$^2$. Here, the amount of F is required to be an amount of about ⅓ of the area density of Mo including a portion of an electron which has been moved to the valence electron band side due to N. Accordingly, the necessary amount of F is 0.58 (=¼+⅓) times the amount of Mo. Its work function is 4.1 eV. In this way, by using an HfON electrode having Mo added therein, a pMIS transistor is formed; and by adding F (or H or Ta) therein, an nMIS transistor is formed. Thus, it is possible to reduce a threshold voltage to not more than 0.4 V with respect to the both transistors.

First Modification of the Second Embodiment

As a first modification of the second embodiment, Mo is added to produce an in-gap state; and N or a substance selected among C, B, Mg, Ca, Sr, Ba, Al, Sc, Y, La and a lanthanoid (for example, Ce, Pr, Nd, Pm, Sm, Eu, Gd, Tb, Dy, Ho, Er, Tm, Yb, Lu) is introduced into a pMIS transistor, thereby optimizing the in-gap state. A substance selected among F, H and Ta is introduced into an nMIS transistor, thereby optimizing the in-gap state. In this embodiment, N (or the foregoing substance such as Mg) is introduced into both the nMIS transistor and a pMIS transistor; and F is introduced into only the nMIS transistor.

Inversely, the same is applicable to a pattern in which Ta (or F or H) is introduced into the nMIS transistor and the pMIS transistor; and N is introduced into only the pMIS transistor. Alternatively, a pattern in which Ta (or F or H) is introduced into only the nMIS transistor; and N (or the foregoing substance such as Mg) is introduced into only the pMIS transistor is applicable, too. According to this, the nMIS transistor and the pMIS transistor were prepared, and it was confirmed that a low threshold operation could be achieved.

Second Modification of the Second Embodiment

Similar to the second modification of the first embodiment as shown in FIG. 14C, as a semiconductor device of a second modification of the second embodiment, a structure in which W is used as an electrode, and in which a 5 nm-thick HfON thin film having Mo added therein for a pMIS transistor and a 5 nm-thick HfONF thin film having Mo added therein for an nMIS transistor are each inserted between a gate dielectric film and the W electrode, was prepared. Here, the addition density of each of Mo, N and F was exactly equal to that in the second embodiment. The work function is subjected to pinning at an optimal value by the HfON thin film having Mo added therein and the HfONF thin film having Mo added therein, and the HfON thin film having Mo added therein and the HfONF thin film having Mo added therein exhibit sufficient metallic properties. Thus, the resistance by the interfacial control oxide film may not be considered. Since the electrical resistance of W is lower than that of each of the HfON metal having Mo added therein and the HfONF metal having Mo added therein, there is brought an effect for reducing the power dissipation. In this way, by using a laminated electrode of an HfON(F) metal thin film having Mo added therein and a W film, it is possible to reduce the threshold voltage to not more than 0.4 V with respect to both the nMIS transistor and the pMIS transistor.

Third Modification of the Second Embodiment

Similar to the third modification of the first embodiment as shown in FIG. 14C, as a third modification of the second embodiment, a structure in which W is used as an electrode, and in which a 1.5 nm-thick HfON thin film having Mo added therein for a pMIS transistor and a 1.5 nm-thick HfONF thin film having Mo added therein for an nMIS transistor are each inserted as an interfacial control oxide film between a gate dielectric film and the W electrode, was prepared. Here, the addition density of Mo was lower than that in the second embodiment and was $1 \times 10^{13}$ atoms/cm$^2$. The nitrogen concentration of the pMIS transistor was $2.5 \times 10^{12}$ atoms/cm$^2$ in terms of an area density. At that time, the state appears in the inside of a gap of the gate dielectric film made of $HfO_2$. An in-gap level was revealed at a position where it is 5.1 eV as reduced into a work function.

On the other hand, the gate electrode of the nMIS transistor is regulated so as to have an area density of $5.8 \times 10^{12}$ atoms/cm$^2$ by the addition of fluorine (F). At that time, an in-gap level is revealed at a position of 4.1 eV as reduced into a work function in the inside of a gap of the gate dielectric film made of $HfO_2$. Namely, it is possible to consider that the subject structure is a structure in which in the gap of the gate dielectric film, an interfacial state is produced at the position of a work function of 4.1 eV in the nMIS transistor, whereas an interfacial state is produced at the position of a work function of 5.1 eV in the pMIS transistor. At that time, the effective work function of the gate electrode made of W is subjected to pinning at a position of the above-produced interfacial state. In this way, when a dielectric film/HfON(F) ultra-thin film having Mo added therein (not more than 2 nm)/W laminated electrode is used, it is possible to reduce the threshold voltage to not more than 0.4 V with respect to both the nMIS transistor and the pMIS transistor. It is preferable that the ultra-thin film made of HfON or HfONF is not more than 2 nm.

Fourth Modification of the Second Embodiment

As a fourth modification of the second embodiment, a Fin type MISFET as shown in FIG. 15 to FIG. 17 was formed. In this modification, when the same materials as in any one of the second embodiment and the first to third modifications are used in the lamination structure of gate dielectric film/gate electrode or the lamination structure of gate dielectric film/interfacial control oxide film/gate electrode, it is possible to exhibit the same effects as in the second embodiment and the first to third modifications. That is, by introducing the additive, the state is produced in the gap of the interfacial control oxide film, thereby moving the energy position of this state to an optimal position by fluorine (F) or nitrogen (N) or the like. Then, it is possible to subject the effective work function of a gate metal to pinning at the moved energy position.

In the second embodiment and its modifications, a fully depleted SOI (silicon on insulator) substrate can be used in place of the silicon substrate. In that case, it is considered that an optimal work function is inclined to the central direction of the gap of Si. In that case, it is possible to control it at an optimal value by regulating the addition amount of F or N or the like.

Also, in the second embodiment and its modifications, a compound semiconductor substrate such as a Ge substrate and a GaAs substrate can be used in place of the silicon substrate. In that case, a CMIS device can be prepared in the same manner as in the case of the Si substrate. A difference resides only in the matter that a value of the optimal work function is deviated. For example, in the case of the Ge substrate, an optimal value for nMIS transistors is 4.0 eV; and an optimal value for pMIS transistors is 4.66 eV. For example, in preparing an interfacial control oxide film for pMIS transistors, the application is possible by decreasing the N amount. Thereafter, in order to cope with the nMIS transistor, the amount of F to be added is made to cope therewith. Specifically, by regulating the N amount at $0.18 \times 10^{14}$ atoms/$cm^2$ and the F amount at $0.58 \times 10^{14}$ atoms/$cm^2$, respectively, it is possible to prepare a CMIS device with a low threshold value relative to the Ge substrate.

Third Embodiment

Next, a semiconductor device according to a third embodiment of the invention is described with reference to FIG. 19A to FIG. 19C.

A semiconductor device according to this embodiment includes an nMIS transistor and a pMIS transistor on a silicon substrate, and these MIS transistors are of the foregoing Type-C. Steps of manufacturing the semiconductor device of this embodiment are shown in FIG. 19A to FIG. 19C. The semiconductor according to this embodiment is formed in the following manner.

First of all, similar to the first embodiment, a device separating region 4 is formed on a silicon substrate 2 (FIG. 19A). Thereafter, a p-well 6 is formed in the nMIS transistor forming region, and an n-well 8 is formed in the pMIS transistor forming region. Subsequently, in order to regulate the threshold voltage, impurities are introduced into the p-well 6 and the n-well 8.

Next, as shown in FIG. 19A, a gate dielectric film 50 is formed on the silicon substrate 2. This gate dielectric film 50 was formed by depositing LaYO$_3$ having a thickness of 3 nm by means of a sputtering method at a temperature of the silicon substrate 2 of 400° C. Here, fabrication is carried out by sputtering an LaYO$_3$ target in Ar/O$_2$. Thereafter, a 10 nm-thick hafnium oxide film 52 having V added therein was deposited at a temperature of the silicon substrate 2 of 400° C. For this hafnium oxide film 52, fabrication is carried out by simultaneously sputtering an HfO$_2$ target and a V target in Ar/O$_2$. Furthermore, an SiO$_2$ film (not shown) is fabricated, and the entire surface thereof is subjected to ion injection with F, thereby preparing an HfOF film 52 having V added therein. Thereafter, the foregoing SiO$_2$ film is removed.

Next, a photoresist is coated on the HfOF film 52 having V added therein, and a resist pattern 54 having an opening on the nMIS transistor forming region is formed by means of a lithography technology (FIG. 19B). F is additionally added only in the nMIS transistor forming region, using this resist pattern 54 as a mask, by means of an ion injection method and introduced into the electrode film (HfOF film 52) on the nMIS transistor forming region, thereby forming an HfOF film 52a having V added therein and having a high F concentration. Here, though the ion injection method was employed as a method of additionally introducing F, a method of laminating Ta by sputtering and diffusing it by annealing or other methods are also effective. In that case, an HfOF film having V and Ta added therein is formed. Alternatively, atomic hydrogen may be taken in by exposure to excitation hydrogen. In that case, an HfONH film having V added therein is formed. Alternatively, it is also effective to additionally add Ta only in the nMIS transistor forming region starting from the HfO$_2$ film having V and Ta added therein.

Next, after removing the resist pattern 54, a photoresist is coated on the electrode films 52 and 52a, and the foregoing photoresist is subjected to patterning by means of a usual lithography technology, thereby forming a resist pattern (not shown) for forming a gate electrode. By carrying out etching using this resist pattern as a mask, the electrode films are subjected to patterning, thereby obtaining the respective gate electrodes. Thereafter, a CMIS device is accomplished through the preparation of source/drain regions 56a and 56b of an nMIS transistor and source/drain regions 58a and 58b of a pMIS transistor.

In this embodiment, the gate electrode of a pMIS transistor is HfOF having V added therein and had an area density of V of $1.2 \times 10^{14}$ atoms/$cm^2$ and an F concentration of $0.8 \times 10^{14}$ atoms/$cm^2$ in terms of an area density. Its work function is 5.1 eV. On the other hand, in the gate electrode of an nMIS transistor, F was additionally added and had an F concentration of $1.2 \times 10^{14}$ atoms/$cm^2$ in terms of an area density. Its work function is 4.1 eV. In this way, by using an HfOF electrode having V added therein, a pMIS transistor is formed; and by additionally adding F (or H or Ta) therein, an nMIS transistor is formed. Thus, it is possible to reduce a threshold voltage to not more than 0.4 V with respect to both transistors.

First Modification of Third Embodiment

As a first modification of the third embodiment, a substance selected among V, Cr, Mn, Tc and Re is added to produce an in-gap state; and a substance selected among F, H and Ta is introduced to optimize the in-gap state, thereby optimizing the in-gap state of each of a pMIS transistor and an nMIS transistor. According to this, an nMIS transistor and a pMIS transistor were prepared. Thus, it was confirmed that a low threshold operation could be achieved.

Second Modification of the Third Embodiment

Similar to the first modification of the first embodiment as shown in FIG. 14C, as a second modification of the third embodiment, a structure in which W is used as an electrode, and in which a 3 nm-thick HfOF thin film having V added therein for a pMIS transistor and a 3 nm-thick HfOF thin film having V added and having F additionally added therein for an nMIS transistor are each inserted between a gate dielectric film and the W electrode, was prepared. Here, the addition density of each of V and F was exactly equal to that in the third embodiment. The work function is subjected to pinning at an optimal value by the 3 nm-thick HfON thin film having V added therein, and the 3 nm-thick HfONF thin film having W added therein exhibits sufficient metallic properties. Thus, the resistance by the interfacial control oxide film with W may not be considered. Since the electrical resistance of W is lower than that of the HfOF metal having V added therein, there is brought an effect for reducing the power dissipation. In this way, by using a laminated electrode of an HfOF metal thin film having V added therein and a W film, it is possible to reduce the threshold voltage to not more than 0.4 V with respect to both the nMIS transistor and the pMIS transistor.

Third Modification of the Third Embodiment

Similar to the third modification of the first embodiment as shown in FIG. 14C, as a third modification of the third embodiment, a structure in which W is used as an electrode, and in which a 1.5 nm-thick HfOF thin film having V added therein for a pMIS transistor and a 1.5 nm-thick HfOF thin film having V added and having F additionally added therein for an nMIS transistor are each inserted between a gate dielectric film and the W electrode, was prepared. Here, the addition density of each of V and F was lower than that in the third embodiment and was $1\times10^{13}$ atoms/cm$^2$. The F concentration of the pMIS transistor was $6.7\times10^{12}$ atoms/cm$^2$ in terms of an area density. At that time, the state appears in the inside of a gap of the gate dielectric film made of HfO$_2$. An in-gap level was revealed at a position where it is 5.1 eV as reduced into a work function.

On the other hand, the gate electrode of the nMIS transistor is regulated so as to have an area density of $1\times10^{13}$ atoms/cm$^2$ by increasing the F concentration. At that time, an in-gap level is revealed at a position of 4.1 eV as reduced into a work function in the inside of a gap of the gate dielectric film made of HfO$_2$. Namely, it is possible to consider that the subject structure is a structure in which, in the gap of the gate dielectric film, an interfacial state is produced at the position of a work function of 4.1 eV in the nMIS transistor, whereas an interfacial state is produced at the position of a work function of 5.1 eV on the pMIS transistor. At that time, the effective work function of the gate electrode made of W is subjected to pinning at a position of the above-produced interfacial state. In this way, when a laminated electrode of a dielectric film, a thin film made of HfOF having V added therein and a W film is used, it is possible to reduce the threshold voltage to not more than 0.4 V with respect to both the nMIS transistor and the pMIS transistor. It is preferable that a thickness of the thin film made of HfONF is not more than 2 nm.

Fourth Modification of the Third Embodiment

As a fourth modification of the second embodiment, a Fin type MISFET as shown in FIG. 15 to FIG. 17 was formed. In this modification, when the same materials as in any one of the third embodiment and the first to third modifications thereof are used in the lamination structure of gate dielectric film/gate electrode or the lamination structure of gate dielectric film/interfacial control oxide film/gate electrode, it is possible to exhibit the same effects as in the third embodiment and the first to third modifications thereof. That is, by introducing the additive, the state is produced in the gap of the gate electrode or the interfacial control oxide film, thereby moving the energy position of this state to an optimal position by fluorine (F) or the like. Then, it is possible to subject the effective work function of a gate metal to pinning at the moved energy position.

In the third embodiment and its modifications, a fully depleted SOI (silicon on insulator) substrate can be used in place of the silicon substrate. In that case, it is considered that an optimal work function is inclined to the central direction of the gap of Si. In that case, it is possible to control it at an optimal value by regulating the addition amount of F or the like.

Also, in the third embodiment and its modifications, a compound semiconductor substrate such as a Ge substrate and a GaAs substrate can be used in place of the silicon substrate. In that case, a CMIS device can be prepared in the same manner as in the case of the Si substrate. A difference resides only in the matter that a value of the optimal work function is deviated. For example, in the case of the Ge substrate, an optimal value for nMIS transistors is 4.0 eV; and an optimal value for pMIS transistors is 4.66 eV. For example, in preparing an interfacial control oxide film for pMIS transistors, the application is possible by increasing the F amount. Specifically, by regulating the F amount at $0.9\times10^{14}$ atoms/cm$^2$ for pMIS, it is possible to prepare a CMIS device with a low threshold value relative to the Ge substrate.

According to the above-described first, second and third embodiments and modifications thereof, a CMIS device having a sufficiently low threshold voltage (not more than 0.4 V) is obtainable.

As to an Hf oxide or a Zr oxide, an in-gap state is obtained by the addition of a high valence substance. Furthermore, it is possible to regulate the in-gap state at around 4.1 eV or around 5.1 eV in terms of a work function by a second additive. As a result, by using this substance as an electrode, it is possible to freely control the threshold value, thereby obtaining a CMIS device having a threshold value of not more than 0.4 V. Alternatively, by using this substance as an interfacial control oxide substance and taking a structure of gate dielectric film/interfacial control substance/electrode, it is possible to subject an effective work function of the electrode to pinning at an optimal value for nMIS transistors or pMIS transistors. As a result, a CMIS device having a threshold voltage of not more than 0.4 V is obtainable.

Also, in the foregoing first, second and third embodiments and modifications thereof, the Hf oxide film made of an Hf oxide is any one of HfO$_2$, HfSiO$_4$ and HfSiON or may be made of a laminated film thereof. Also, a Zr oxide film made of a Zr oxide can be used; and this Zr oxide film is any one of ZrO$_2$, ZrSiO$_4$ and ZrSiON or may be made of a laminated film thereof.

In the foregoing embodiments, while the configurations in which a CMIS structure of an embodiment formed on a silicon substrate have been described, it should not be construed that the invention is limited to these structures. It is possible to form a CMIS structure of an embodiment of the invention by forming a silicon layer on a substrate other than the silicon substrate, for example, a glass substrate. Alternatively, it is possible to apply a thought of an embodiment of the invention directly to all of substrates of a compound semiconductor, such as a Ge substrate and a GaAs substrate. In that case, the optimal work function changes. Also, it is possible to form a CMIS structure of an embodiment of the invention by forming a compound semiconductor layer such as a Ge layer, an SiGe layer and a GaAs layer in a part on the Si substrate. In that case, it is possible to take a modification in which an SiGe layer is formed only in a channel of one side (for example, a pMIS side), whereby an Si channel is made to remain in the other channel (for example, an nMIS side).

In the case of a compound semiconductor substrate such as a Ge substrate and a GaAs substrate, it is possible to prepare a CMIS device in the same manner as in the case of an Si substrate. A difference resides only in the matter that a value of the optimal work function is deviated. For example, in the case of a Ge substrate, an optimal value for nMIS transistors is 4.0 eV; and an optimal value for pMIS transistors is 4.66 eV. An interfacial state may be prepared at an optimal position against each substrate by a method as described in an embodiment of the invention.

Besides, it will be apparent to one skilled in the art that various changes and modifications can be made herein without departing from the spirit and scope thereof.

The invention claimed is:

1. A semiconductor device, comprising:
a semiconductor substrate having a first semiconductor layer and a second semiconductor layer separated from each other;
an nMIS transistor including,
a first source region and a first drain region, formed in the first semiconductor layer and separated from each other,
a first gate dielectric film covering a first channel region which is the first semiconductor layer between the first source region and the first drain region, and
a first gate electrode formed on the first gate dielectric film and including an Hf oxide film or a Zr oxide film in which a first element selected from a first group comprising Nb and W is added, and a second element selected from a second group comprising N, C, B, Mg, Ca, Sr, Ba, Al, Sc, Y, La, Ce, Pr, Nd, Pm, Sm, Eu, Gd, Tb, Dy, Ho, Er, Tm, Yb and Lu is added; and
a pMIS transistor including,
a second source region and a second drain region, formed in the second semiconductor layer and separated from each other,
a second gate dielectric film covering a second channel region which is the second semiconductor layer between the second source region and the second drain region, and
a second gate electrode formed on the second gate dielectric film and including an Hf oxide film or a Zr oxide film in which the first element is added, and the second element is added in a larger amount than that in the first gate electrode.

2. The semiconductor device according to claim 1, wherein the nMIS transistor and the pMIS transistor are each a Fin MIS transistor.

3. The semiconductor device according to claim 1, wherein the added amount $[\alpha]$ (atom/cm$^2$) of the first element $\alpha$ selected from the first group and the added amount $[\beta]$ (atom/cm$^2$) of the second element $\beta$ selected from the second group satisfy the following expression:

$$0.08 \times [\alpha] < [\beta] \times K < [\alpha] \times ([\text{Number of electrons in the outermost shell of the element } \alpha] - 4),$$

wherein the number of electrons in the outermost shell of the first element $\alpha$ is 5 for Nb and 6 for W, respectively;
when the second element $\beta$ is N, then K is 1;
when the second element $\beta$ is C, then K is 2;
when the second element $\beta$ is B, then K is 3;
when the second element $\beta$ is Mg, Ca, Sr or Ba, then K is 2; and
when the second element $\beta$ is Al, Sc, Y, La, Ce, Pr, Nd, Pm, Sm, Eu, Gd, Tb, Dy, Ho, Er, Tm, Yb or Lu, then K is 1.

4. The semiconductor device according to claim 1, wherein the first element which is selected from the first group has an area density of $1 \times 10^{14}$ atoms/cm$^2$ or more and not more than $8 \times 10^{14}$ atoms/cm$^2$.

5. The semiconductor device according to claim 1, wherein the first element which is selected from the first group has an area density of $6 \times 10^{12}$ atoms/cm$^2$ or more and less than $1 \times 10^{14}$ atoms/cm$^2$.

6. A semiconductor device, comprising:
a semiconductor substrate having a first semiconductor layer and a second semiconductor layer separated from each other;
an nMIS transistor including,
a first source region and a first drain region, which regions are formed in the first semiconductor layer and separated from each other,
a first gate dielectric film covering a first channel region which is the first semiconductor layer between the first source region and the first drain region,
a first gate electrode formed on the first gate dielectric film and including an Hf oxide film or a Zr oxide film in which Mo is added, and a first element selected from a first group comprising F, H and Ta is added; and
a pMIS transistor including,
a second source region and a second drain region, which regions are formed in the second semiconductor layer and separated from each other,
a second gate dielectric film covering a second channel region which is the second semiconductor layer between the second source region and the second drain region, and
a second gate electrode formed on the second gate dielectric film and including an Hf oxide film or a Zr oxide film in which the first element is added, and the second element is added in a smaller amount than that in the first gate electrode.

7. The semiconductor device according to claim 6, wherein the nMIS transistor and the pMIS transistor are each a Fin MIS transistor.

8. The semiconductor device according to claim 6, wherein the added amount $[\eta]$ (atom/cm$^2$) of the first element $\eta$ which is selected from the first group and added and the added amount $[\theta]$ (atom/cm$^2$) of the second element $\theta$ which is selected from the second group and added satisfy the following expression:

$$0.08 \times [\eta] < [\theta] \times [\eta] \times (8 - [\text{Number of electrons in the outermost shell of the first element } \eta]),$$

wherein the number of electrons in the outermost shell of the first element $\eta$ is 5 for V, 6 for Cr and 7 for Mn, Tc or Re, respectively.

9. The semiconductor device according to claim 6, wherein the first element which is selected from the first group and added has an area density of $1 \times 10^{14}$ atoms/cm$^2$ or more and not more than $8 \times 10^{14}$ atoms/cm$^2$.

10. The semiconductor device according to claim 6, wherein the first element which is selected from the first group and added has an area density of $6\times10^{12}$ atoms/cm$^2$ or more and less than $1\times10^{14}$ atoms/cm$^2$.

11. The semiconductor device according to claim 1, wherein when the first and second gate electrodes include an Hf oxide film, the Hf oxide film is made of any one of hafnium oxide, hafnium silicate and hafnium nitride silicate or a laminated film thereof; and when the first and second gate electrodes include a Zr oxide film, the Zr oxide film is made of any one of zirconium oxide, zirconium silicate and zirconium nitride silicate or a laminated film thereof.

\* \* \* \* \*